(12) United States Patent
Song et al.

(10) Patent No.: US 11,393,994 B2
(45) Date of Patent: Jul. 19, 2022

(54) DISPLAY APPARATUS

(71) Applicant: Samsung Display Co., Ltd., Yongin-Si (KR)

(72) Inventors: Hyunseop Song, Bucheon-si (KR); Seungjae Kang, Asan-si (KR); Sung-Woon Im, Daejeon (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 62 days.

(21) Appl. No.: 16/884,470

(22) Filed: May 27, 2020

(65) Prior Publication Data

US 2020/0411778 A1 Dec. 31, 2020

(30) Foreign Application Priority Data

Jun. 25, 2019 (KR) .................. 10-2019-0075571

(51) Int. Cl.
| H05K 1/00 | (2006.01) |
| H01L 51/00 | (2006.01) |
| H05K 1/11 | (2006.01) |
| H05K 1/14 | (2006.01) |
| H05K 1/02 | (2006.01) |
| H01L 27/32 | (2006.01) |

(52) U.S. Cl.
CPC ...... *H01L 51/0097* (2013.01); *H01L 27/3276* (2013.01); *H05K 1/0281* (2013.01); *H05K 1/118* (2013.01); *H05K 1/147* (2013.01); *H01L 2251/5338* (2013.01)

(58) Field of Classification Search
CPC ............ H01L 51/0097; H01L 27/3276; H05K 1/0281; H05K 1/118

USPC ........................................................ 361/749
See application file for complete search history.

(56) References Cited

U.S. PATENT DOCUMENTS

| 8,514,362 B2 | 8/2013 | Kim | |
| 10,037,984 B2 | 7/2018 | Oh | |
| 2010/0172098 A1* | 7/2010 | Isoshima | H05K 7/20972 |
| | | | 361/697 |
| 2012/0211772 A1* | 8/2012 | Moh | H01L 27/0288 |
| | | | 438/34 |
| 2013/0248826 A1* | 9/2013 | Kim | H01L 51/0097 |
| | | | 257/40 |

(Continued)

FOREIGN PATENT DOCUMENTS

| KR | 1020060134486 A | 12/2006 |
| KR | 101138261 B1 | 4/2012 |

(Continued)

*Primary Examiner* — Andargie M Aychillhum
(74) *Attorney, Agent, or Firm* — Cantor Colburn LLP

(57) ABSTRACT

A display apparatus includes a display panel including first display pads and second display pads spaced apart from the first display pads, a main circuit board, a first flexible circuit board which connects the main circuit board to the first display pads, a second flexible circuit board which connects the main circuit board to the second display pads and overlaps at least a portion of the first flexible circuit board, heat radiation members on the first and second flexible circuit boards, and a deformation prevention member spaced apart from the heat radiation members and disposed on at least one of the first and second flexible circuit boards. The deformation prevention member includes a metal.

20 Claims, 12 Drawing Sheets

(56) References Cited

U.S. PATENT DOCUMENTS

| | | | | |
|---|---|---|---|---|
| 2014/0140043 A1* | 5/2014 | Lee | ............... | G02B 6/0085 |
| | | | | 362/97.1 |
| 2015/0201492 A1* | 7/2015 | Kim | ............... | H05K 1/028 |
| | | | | 361/749 |
| 2018/0068992 A1* | 3/2018 | Oh | ............... | H01L 25/18 |
| 2018/0273711 A1* | 9/2018 | Ke | ............... | C08G 73/1078 |
| 2019/0194533 A1* | 6/2019 | Cho | ............... | C09K 11/02 |

FOREIGN PATENT DOCUMENTS

| | | |
|---|---|---|
| KR | 1020180027692 A | 3/2018 |
| KR | 1020180070919 A | 6/2018 |

* cited by examiner

DISPLAY APPARATUS

This application claims priority to Korean Patent Application No. 10-2019-0075571, filed on Jun. 25, 2019, and all the benefits accruing therefrom under 35 U.S.C § 119, the content of which in its entirety is herein incorporated by reference.

BACKGROUND

1. Field

Embodiments of the invention relate to a display apparatus, and more particularly, to a display apparatus with improved reliability.

2. Description of the Related Art

A display apparatus may have a structure in which a circuit board is connected to a display panel after its fabrication. In such a display apparatus, for example, a tape automated bonding ("TAB") scheme, which uses an anisotropic conductive film ("ACF"), may be used to bond the circuit board to the display panel.

SUMMARY

An exemplary embodiment of the invention provides a display apparatus that prevents defects in a circuit board from occurring when an anisotropic conductive film is bonded.

According to an exemplary embodiment of the invention, a display apparatus includes: a display panel including a plurality of first display pads arranged in a first direction and a plurality of second display pads arranged in the first direction, where the second display pads is spaced apart in a second direction from the first display pads, and the second direction intersects the first direction; a main circuit board; a first flexible circuit board which connects the main circuit board to the first display pads; a second flexible circuit board which connects the main circuit board to the second display pads and overlaps at least a portion of the first flexible circuit board; a plurality of heat radiation members on the first flexible circuit board and the second flexible circuit board; and a deformation prevention member spaced apart from the heat radiation members and disposed on at least one of the first flexible circuit board and the second flexible circuit board, where the deformation prevention member includes a metal.

In an exemplary embodiment, the first flexible circuit board may include a first top surface, a first bottom surface opposite to the first top surface, a plurality of first board pads exposed from the first bottom surface and connected to the first display pads and the main circuit board, and a first driver chip on the first bottom surface. In such an embodiment, the second flexible circuit board may include a second top surface, a second bottom surface opposite to the second top surface, where the second bottom surface covers at least a portion of the first top surface, a plurality of second display pads exposed from the second bottom surface and connected to the second display pads and the main circuit board, and a second driver chip on the second bottom surface. In such an embodiment, the first driver chip and the second driver chip may be spaced apart from each other when viewed in a plan view.

In an exemplary embodiment, the deformation prevention member may be disposed on at least one of the first top surface and the second top surface.

In an exemplary embodiment, the deformation prevention member may be disposed on at least one of the first bottom surface and the second bottom surface, and the deformation prevention member may be spaced apart from the first driver chip and the second driver chip.

In an exemplary embodiment, the deformation prevention member may be disposed on a surface the same as a surface on which the heat radiation members are disposed.

In an exemplary embodiment, the deformation prevention member may be disposed on a surface different from a surface on which the heat radiation members are disposed.

In an exemplary embodiment, each of the first flexible circuit board and the second flexible circuit board may include a dielectric layer, a plurality of board signal lines on the dielectric layer, a solder resist layer in which an opening is defined to expose a portion of the board signal lines, and a plurality of board pads, each of which is connected to a portion of a corresponding board signal line of the board signal lines. In such an embodiment, the portion of the corresponding board signal line may be exposed through the opening, and the board pads of the first flexible circuit board and the board pads of the second flexible circuit board may be connected through a plurality of anisotropic conductive films to the first display pads and the second display pads.

In an exemplary embodiment, the board pads of the first flexible circuit board may include a plurality of first output pads connected to the first display pads and a plurality of first input pads connected to the main circuit board, and the board pads of the second flexible circuit board may include a plurality of second output pads connected to the second display pads and a plurality of second input pads connected to the main circuit board.

In an exemplary embodiment, the first flexible circuit board may include a first output segment where the first output pads are disposed, a first input segment where the first input pads are disposed, and a first connection segment which connects the first output segment to the first input segment, and the second flexible circuit board may include a second output segment where the second output pads are disposed, a second input segment where the second input pads are disposed, and a second connection segment which connects the second output segment to the second input segment. In such an embodiment, the first input segment and the second input segment may be spaced apart from each other.

In an exemplary embodiment, the second output segment may cover at least a portion of the first output segment.

In an exemplary embodiment, a sum of a width in the second direction of the first input segment, a width in the second direction of the first connection segment and a width in the second direction of the first output segment may be less than a sum of a width in the second direction of the second input segment, a width in the second direction of the second connection segment and a width in the second direction of the second output segment.

According to an exemplary embodiment of the invention, a display apparatus includes: a display panel including a plurality of first display pads arranged in a first direction and a plurality of second display pads arranged in the first direction, where the second display pads is spaced apart in a second direction from the first display pads, and the second direction intersects the first direction; a main circuit board; a first flexible circuit board including a first output segment including a plurality of first output pads connected to the first display pads, a first input segment including a plurality of first input pads connected to the main circuit board, and a first connection segment which connects the first output segment to the first input segment; a second flexible circuit board including a second output segment including a plurality of second output pads connected to the second display pads, a second input segment including a plurality of second input pads connected to the main circuit board, and a second connection segment which connects the second output segment to the second input segment; a plurality of heat radiation members on the first flexible circuit board and the second flexible circuit board; and a deformation prevention member spaced apart from the heat radiation members and disposed on at least one of the first input segment and the second input segment.

In an exemplary embodiment, the heat radiation members may include polyimide, and the deformation prevention member may include a metal.

In an exemplary embodiment, the first flexible circuit board may include a first top surface, a first bottom surface which is opposite to the first top surface and exposes the first output pads and the first input pads, and a first driver chip on the first bottom surface. In such an embodiment, the second flexible circuit board may include a second top surface, a second bottom surface which is opposite to the second top surface and exposes the second output pads and the second input pads, and a second driver chip on the second bottom surface. In such an embodiment, the first driver chip and the second driver chip may be spaced apart from each other when viewed in a plan view.

In an exemplary embodiment, the deformation prevention member may be disposed on at least one of the first top surface and the second top surface.

In an exemplary embodiment, the deformation prevention member may be disposed on at least one of the first bottom surface and the second bottom surface, and the deformation prevention member may be spaced apart from the first driver chip and the second driver chip.

In an exemplary embodiment, the deformation prevention member may be disposed on a surface the same as a surface on which the heat radiation members are disposed.

In an exemplary embodiment, the deformation prevention member may be disposed on a surface different from a surface on which the heat radiation members are disposed.

In an exemplary embodiment, the first display pads may be connected through a plurality of anisotropic conductive films to the first output pads, and the second display pads may be connected through a plurality of anisotropic conductive films to the second output pads.

In an exemplary embodiment, the second output segment may cover at least a portion of the first output segment, and the first input segment and the second input segment may be spaced apart from each other.

BRIEF DESCRIPTION OF THE DRAWINGS

The above and other features of the disclosure will become readily apparent by reference to the following detailed description when considered in conjunction with the accompanying drawings, in which.

DETAILED DESCRIPTION

Figure 1:
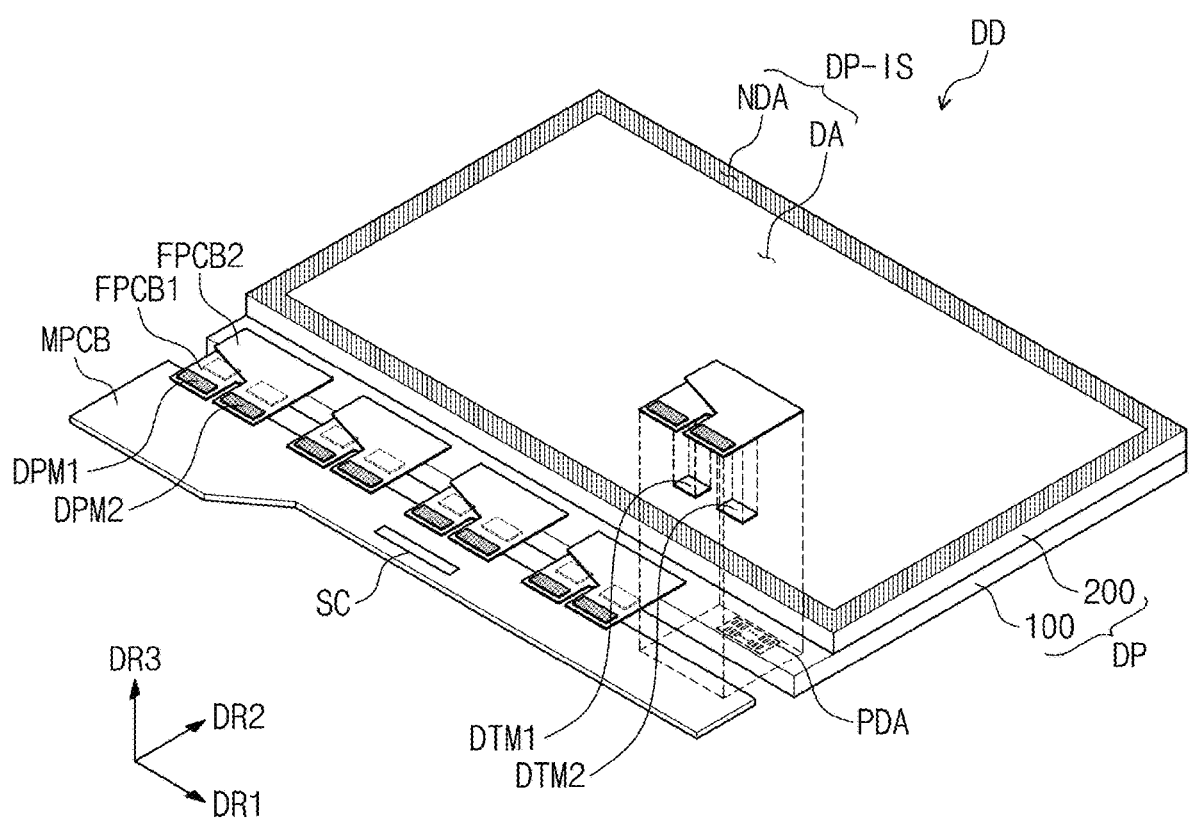
FIG. 1 illustrates a perspective view showing a display apparatus according to an exemplary embodiment of the invention.

The invention now will be described more fully hereinafter with reference to the accompanying drawings, in which various embodiments are shown. The invention may, however, be embodied in many different forms, and should not be construed as limited to the embodiments set forth herein. Rather, these embodiments are provided so that this disclosure will be thorough and complete, and will fully convey the scopes of the invention to those skilled in the art.

In the description, it will be understood that when an element or layer is referred to as being "on", "connected to" or "coupled to" another element or layer, it can be directly on, connected or coupled to the other element or layer or intervening elements or layers may be present. In contrast, the term "directly on", "directly connected to" or "directly coupled to" means that there are no intervening elements.

Like numerals indicate like components. Moreover, in the drawings, thicknesses, ratios, and dimensions of components are exaggerated for effectively explaining the technical contents.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items.

It will be understood that, although the terms first, second, etc. may be used herein to describe various components, these components should not be limited by these terms. These terms are only used to distinguish one component from another component. For example, a first component could be termed a second component, and vice versa without departing from the scope of the invention. Unless the context clearly indicates otherwise, the singular forms are intended to include the plural forms as well.

In addition, the terms "beneath", "lower", "above", "upper", and the like are used herein to describe one component's relationship to other component(s) illustrated in the drawings. The relative terms are intended to encompass different orientations in addition to the orientation depicted in the drawings. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms used herein including technical and scientific terms have the same meaning generally understood by one of ordinary skilled in the art. Also, terms as defined in dictionaries generally used should be understood as having meaning identical or meaning contextually defined in the art and should not be understood as ideally or excessively formal meaning unless definitely defined herein.

It should be understood that the terms "comprise", "include", "have", and the like are used to specify the presence of stated features, integers, steps, operations, components, elements, or combinations thereof, but do not preclude the presence or addition of one or more other features, integers, steps, operations, components, elements, or combinations thereof.

Exemplary embodiments are described herein with reference to cross-sectional illustrations and/or plane illustrations that are idealized exemplary illustrations. In the drawings, the thicknesses of layers and regions are exaggerated for clarity. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of exemplary embodiments.

Hereinafter, exemplary embodiments of the disclosure will be described in detail with reference to the accompanying drawings.

Figure 2:
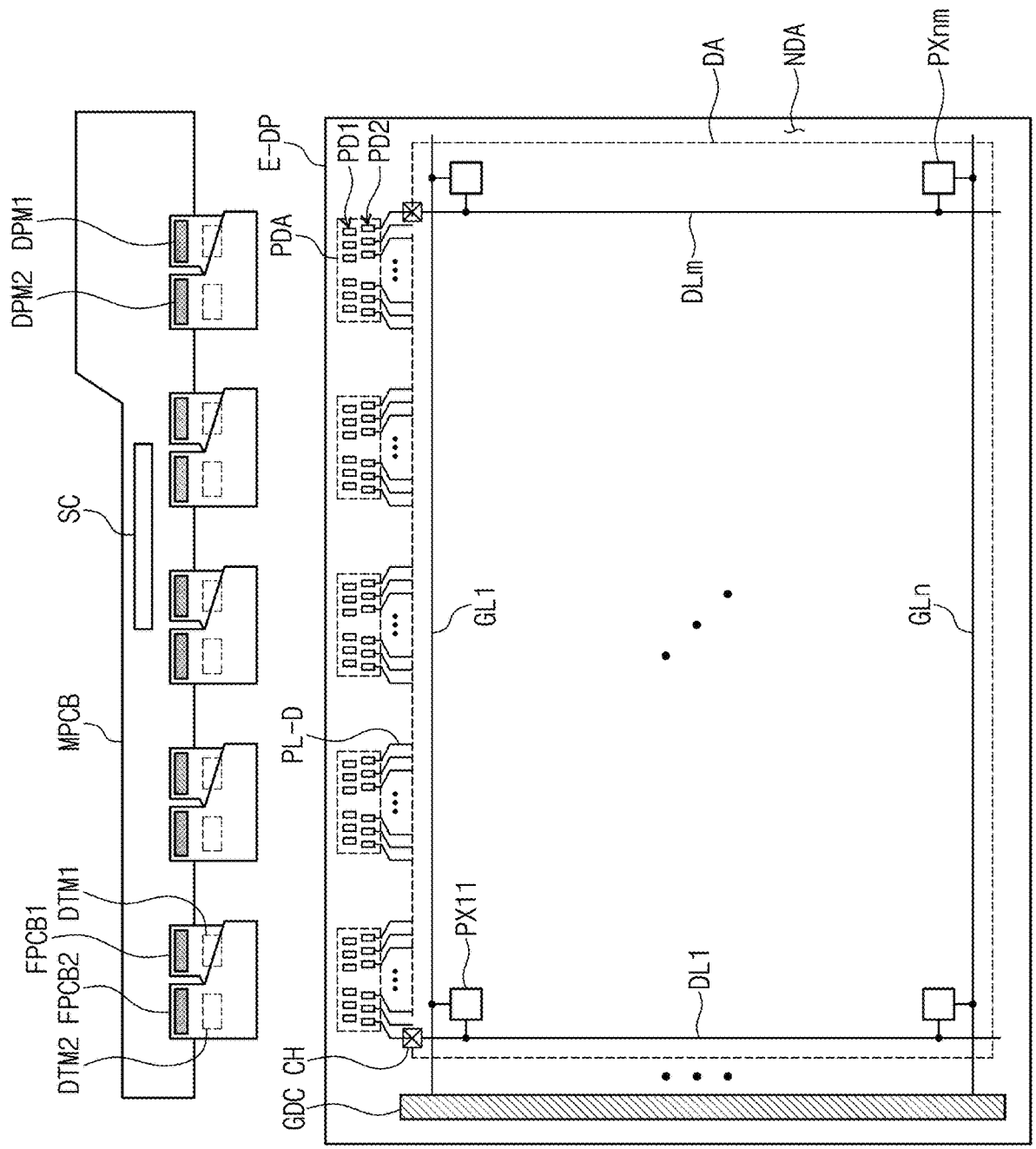
FIG. 2 illustrates a plan view showing a display apparatus according to an exemplary embodiment of the invention.
Figure 3A:
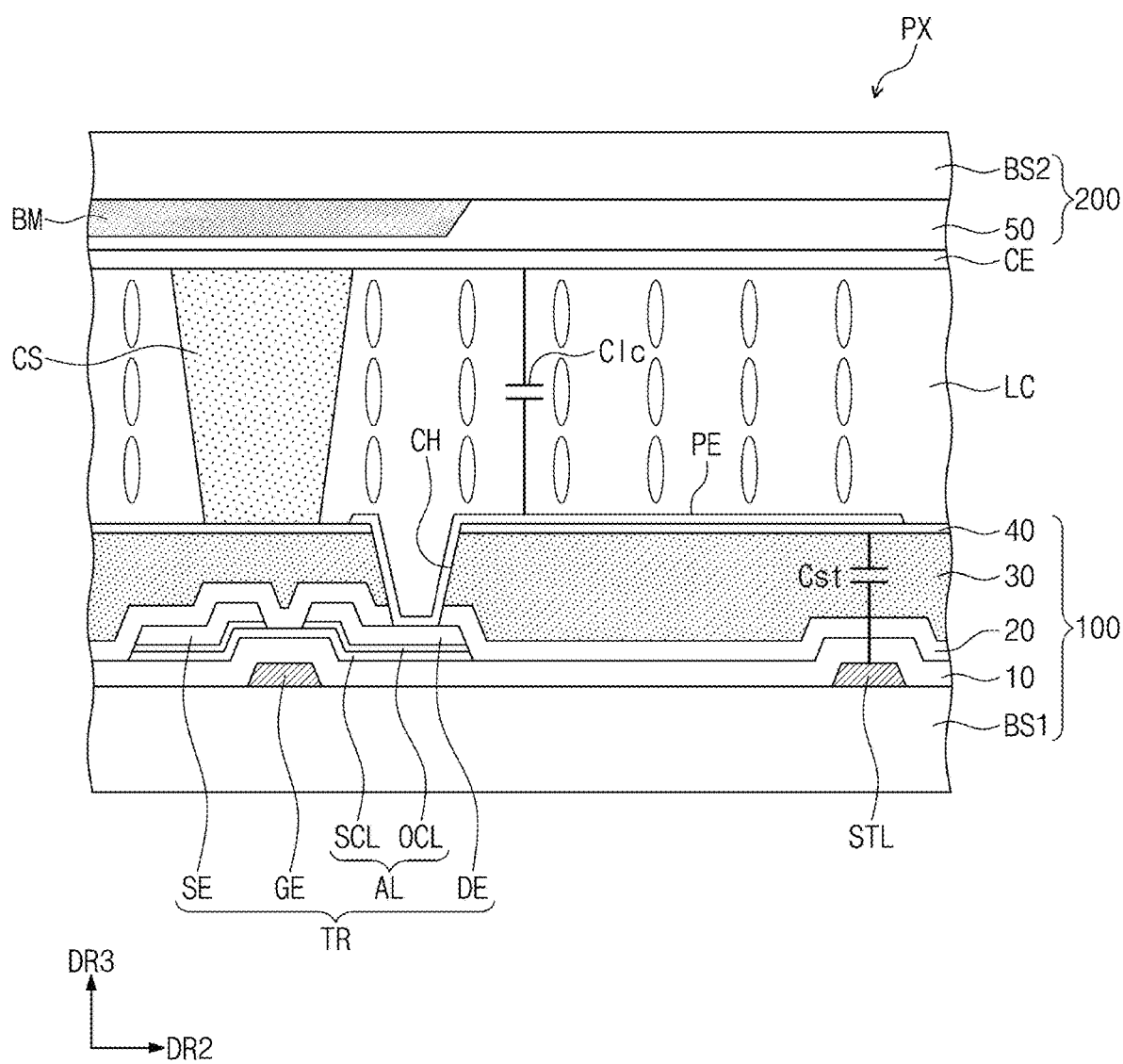
FIGS. 3A and 3B illustrate cross-sectional views showing a display region of a display panel according to an exemplary embodiment of the invention.
Figure 3B:
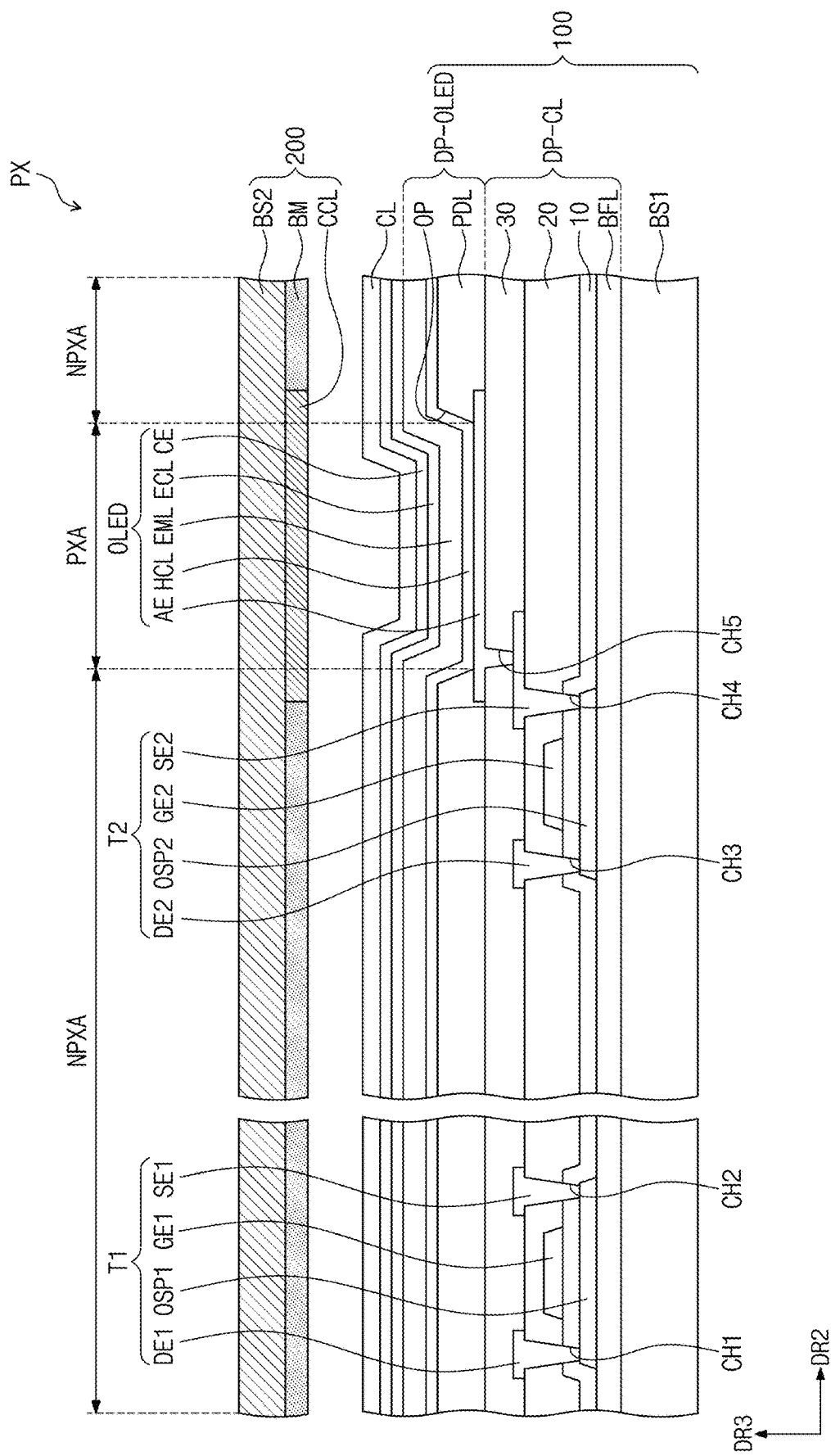

FIG. 1 illustrates a perspective view showing a display apparatus according to an exemplary embodiment of the invention. FIG. 2 illustrates a plan view showing a display apparatus according to an exemplary embodiment of the invention. FIGS. 3A and 3B illustrate cross-sectional views showing a display region of a display panel according to an exemplary embodiment of the invention.

Referring to FIGS. 1 and 2, an exemplary embodiment of a display apparatus DD includes a display panel DP, flexible circuit boards FPCB1 and FPCB2, a main circuit board MPCB, deformation prevention members DPM1 and DPM2, and heat radiation members DTM1 and DTM2.

Although not shown, the display apparatus DD may further include a chassis member or a molding member, and still further include a backlight unit, based on a type of the display panel DP.

The display panel DP may be one of a liquid crystal display panel, a plasma display panel, an electrophoretic display panel, a microelectromechanical system ("MEMS") display panel, an electro-wetting display panel, and an organic light emitting display panel, but the invention is not limited thereto.

The display panel DP may include a first display substrate 100 and a second display substrate 200 that faces and is spaced apart from the first display substrate 100. The display panel DP may further include a grayscale display layer for image display between the first display substrate 100 and the second display substrate 200. The grayscale display layer may include a liquid crystal layer, an organic light emitting layer, an electrophoretic layer, or the like, based on a type the display panel DP.

In an exemplary embodiment, as shown in FIG. 1, the display panel DP may display an image on a display surface DP-IS. The display surface DP-IS is parallel to a plane defined by a first directional axis DR1 and a second directional axis DR2. The display surface DP-IS may include a display region DA and a non-display region NDA. The non-display region NDA is defined along an edge of the display surface DP-IS. The non-display region NDA may surround the display region DA. In an exemplary embodiment, the non-display region NDA may be disposed on only a one-side portion of the display region DA, in which one-side portion is adjacent to the flexible circuit boards FPCB1 and FPCB2.

A third directional axis DR3 indicates a normal direction of the display surface DP-IS, or a thickness direction of the display panel DP. The third directional axis DR3 differentiates a front surface (or top surface) and a rear surface (or bottom surface) of each component which will be discussed below. However, the first, second, and third directional axes DR1, DR2, and DR3 are merely exemplary. First, second, and third directions are defined hereinafter to refer to directions respectively indicated by the first, second, and third directional axes DR1, DR2, and DR3, and are allocated the same reference numerals thereto.

In an exemplary embodiment, as shown in FIG. 1, the display panel DP may have a flat display surface, but the invention is not limited thereto. The display apparatus DD may include a curved display surface or a cubic display surface. The cubic display surface may include a plurality of display regions oriented in different directions.

A signal controller SC may be disposed or mounted on the main circuit board MPCB. The signal controller SC receives image data and control signals from a graphic controller (not shown) provided externally. The signal controller SC may provide the display panel DP with control signals.

The flexible circuit boards FPCB1 and FPCB2 may be coupled to the display panel DP and the main circuit board MPCB through conductive adhesive members. The conductive adhesive members may include an anisotropic conductive film ("ACF"). Such an ACF will be described below in greater detail.

In an exemplary embodiment, the flexible circuit boards FPCB1 and FPCB2 may include a first flexible circuit board FPCB1 and a second flexible circuit board FPCB2, and each of the first and second flexible circuit boards FPCB1 and FPCB2 may be provided in plural. In an exemplary embodiment, the two types of the flexible circuit boards FPCB1 and FPCB2 may be coupled to different pad rows on each display pad region PDA. In an exemplary embodiment, the display pad region PDA may be defined on the first display substrate 100, but the invention is not limited thereto. In an alternative exemplary embodiment, the display pad region PDA may be defined on the second display substrate 200.

The deformation prevention members DPM1 and DPM2 may include a first deformation prevention member DPM1 and a second deformation prevention member DPM2, and each of the first and second deformation prevention members DPM1 and DPM2 may be provided in plural. The deformation prevention members DPM1 and DPM2 may be correspondingly disposed on the flexible circuit boards FPCB1 and FPCB2. In one exemplary embodiment, for example, the first deformation prevention member DPM1 and the second deformation prevention member DPM2 may be disposed on the first flexible circuit board FPCB1 and the second flexible circuit board FPCB2, respectively.

The deformation prevention members DPM1 and DPM2 may be deposited and patterned on the flexible circuit boards FPCB1 and FPCB2, or tapes may be separately provided to attach the deformation prevention members DPM1 and DPM2 to the flexible circuit boards FPCB1 and FPCB2. The deformation prevention members DPM1 and DPM2 may be disposed on the flexible circuit boards FPCB1 and FPCB2, and may increase rigidity of the flexible circuit boards FPCB1 and FPCB2.

The deformation prevention members DPM1 and DPM2 may include a restorative material. In one exemplary embodiment, for example, the deformation prevention members DPM1 and DPM2 may include at least one selected from polyethylene terephthalate ("PET"), polyimide ("PI"), aluminum (Al), copper (Cu), silicon, rubber, Teflon®, ACE® tape, a cloth tape, OAM tape, OPP tape, and TPU tape.

FIG. 1 shows an exemplary embodiment where the first deformation prevention member DPM1 and the second deformation prevention member DPM2 are respectively disposed on the first flexible circuit board FPCB1 and the second flexible circuit board FPCB2, but the invention is not limited thereto. Alternatively, one of the first and second deformation prevention members DPM1 and DPM2 may be omitted.

The deformation prevention members DPM1 and DPM2 may prevent deformation of the flexible circuit boards FPCB1 and FPCB2. When the flexible circuit boards FPCB1 and FPCB2 are coupled through ACFs to the display panel DP, the flexible circuit boards FPCB1 and FPCB2 may be compressed with a tool bar at high temperature, such that the flexible circuit boards FPCB1 and FPCB2 may be deformed due to heat transferred by radiation from the tool bar at high temperature and/or by conduction through the flexible circuit boards FPCB1 and FPCB2.

According to exemplary embodiments of the invention, the deformation prevention members DPM1 and DPM2 are included to increase rigidity of the flexible circuit boards FPCB1 and FPCB2, such that the flexible circuit boards FPCB1 and FPCB2 may be effectively prevented from being deformed when an ACF is used for bonding of the flexible circuit boards FPCB1 and FPCB2. Accordingly, in such an embodiment, alignment between pads and to provide the display apparatus DD may be improved with increased reliability.

In an exemplary embodiment, where an ACF is used to couple the flexible circuit boards FPCB1 and FPCB2 to the display panel DP, the deformation prevention members DPM1 and DPM2 include a metal, such as aluminum (Al) or copper (Cu), selected from refractory materials.

The heat radiation members DTM1 and DTM2 may include a first heat radiation member DTM1 and a second heat radiation member DTM2, and each of the first and second heat radiation members DTM1 and DTM2 may be provided in plural. The heat radiation members DTM1 and DTM2 may be correspondingly disposed on the flexible circuit boards FPCB1 and FPCB2. In one exemplary embodiment, for example, the first heat radiation member DTM1 and the second heat radiation member DTM2 may be disposed on the first flexible circuit board FPCB1 and the second flexible circuit board FPCB2, respectively.

In an exemplary embodiment, the heat radiation members DTM1 and DTM2 may be disposed to be spaced apart from the deformation prevention members DPM1 and DPM2 across the flexible circuit boards FPCB1 and FPCB2. In one exemplary embodiment, for example, the first heat radiation member DTM1 may be disposed to be spaced apart from the first deformation prevention member DPM1 across the first flexible circuit board FPCB1, and the second heat radiation member DTM2 may be disposed to be spaced apart from the second deformation prevention member DPM2 across the second flexible circuit board FPCB2.

The heat radiation members DTM1 and DTM2 may be deposited and patterned on the flexible circuit boards FPCB1 and FPCB2, or tapes may be separately provided to attach the heat radiation members DTM1 and DTM2 to the flexible circuit boards FPCB1 and FPCB2. The heat radiation members DTM1 and DTM2 may be disposed on the flexible circuit boards FPCB1 and FCB2, and may absorb heat generated from the flexible circuit boards FPCB1 and FPCB2, such that damage to the flexible circuit boards FPCB1 and FPCB2 due to the heat may be effectively prevented.

The heat radiation members DTM1 and DTM2 may include a refractory polymeric compound. In one exemplary embodiment, for example, the heat radiation members DTM1 and DTM2 may include at least one selected from PET and PI.

FIG. 2 shows a planar arrangement relationship between pixels PX11 to PXnm and signal lines GL1 to GLn, DL1 to DLm, and PL-D. The signal lines GL1 to GLn, DL1 to DLm, and PL-D may include a plurality of gate lines GL1 to GLn, a plurality of data lines DL1 to DLm, and a plurality of subsidiary signal lines PL-D.

The plurality of gate lines GL1 to GLn extend in the first direction DR1 and are arranged in the second direction DR2, and the plurality of data lines DL1 to DLm are insulated from and intersect the plurality of gate lines GL1 to GLn. The plurality of gate lines GL1 to GLn and the plurality of data lines DL1 to DLm are disposed to overlap the display region DA. The plurality of subsidiary signal lines PL-D are disposed to overlap the non-display region NDA, and are connected to the plurality of gate lines GL1 to GLn and the plurality of data lines DL1 to DLm.

In an exemplary embodiment, second subsidiary signal lines PL-D connected to the data lines DL1 to DLm may be disposed in a different layer from a layer in which the data lines DL1 to DLm are disposed. In such an embodiment, the data lines DL1 to DLm may be electrically connected through contact holes CH to corresponding second subsidiary signal lines PL-D. The contact holes CH is defined through a dielectric layer between the data lines DL1 to DLm and the second subsidiary signal lines PL-D. FIG. 2 shows an exemplary embodiment where two contact holes CH are defined.

In an alternative exemplary embodiment, the contact holes CH may be omitted. In such an embodiment, the data lines DL1 to DLm and the second subsidiary signal lines PL-D may be disposed in a same layer as each other. In such an embodiment, a single signal line may be defined to include one of the data lines DL1 to DLm and a corresponding one of the second subsidiary signal lines PL-D, which is connected to the one of the data lines DL1 to DLm. The one of the data lines DL1 to DLm and the corresponding one of the second subsidiary signal lines PL-D may be defined by different portions of the single signal line.

The pixels PX11 to PXnm may be disposed in the display region DA. No pixels PX11 to PXnm may be disposed in the non-display region NDA. Each of the pixels PX11 to PXnm is connected to a corresponding one of the plurality of gate lines GL1 to GLn and to a corresponding one of the plurality of data lines DL1 to DLm. Each of the pixels PX11 to PXnm may include a pixel driver circuit and a display element.

In an exemplary embodiment, the pixels PX11 to PXnm may be arranged in a matrix shape, but the invention is not limited thereto. Alternatively, the pixels PX11 to PXnm may be disposed in a pentile shape. In such an embodiment, the pixels PX11 to PXnm may be disposed in a diamond shape.

In an exemplary embodiment, as shown in FIG. 2, two pad rows PD1 and PD2 are defined on each of the display pad regions PDA. Each of the two pad rows PD1 and PD2 includes a plurality of pads arranged in the first direction DR1. A first display pad row PD1 and a second display pad row PD2 are spaced apart in the second direction DR2 intersecting the first direction DR1. In an exemplar embodiment, the second display pad row PD2 is disposed farther away than the first display pad row PD1 from an edge E-DP of the display panel DP in the second direction DR2 and closer than the first display pad row PD1 to the display region DA in the second direction DR2. The pads of the first and second pad rows PD1 and PD2 are connected to corresponding second subsidiary signal lines PL-D, respectively.

A gate driver circuit GDC may be integrated on the display panel DP through an oxide silicon gate driver circuit ("OSG") process or an amorphous silicon gate driver circuit ("ASG") process.

FIGS. 3A and 3B illustrate cross-sectional views showing the display region DA of the display panel DP according to an exemplary embodiment of the invention. FIG. 3A illustrates a cross-sectional view showing a pixel PX of a liquid crystal display panel, and FIG. 3B illustrates a cross-sectional view showing a pixel PX of an organic light emitting display panel.

Referring to FIG. 3A, in an exemplary embodiment, a liquid crystal layer LC may be included as a grayscale display layer of the display panel DP. In such an embodiment, the display panel DP may be a liquid crystal display panel. A pixel PX of the liquid crystal display panel may include a transistor TR, a liquid crystal capacitor Clc, and a storage capacitor Cst.

The transistor TR includes a control electrode GE connected to a gate line, an activation part AL that overlaps the control electrode GE, an input electrode SE connected to a data line, and an output electrode DE spaced apart from the input electrode SE. The liquid crystal capacitor Clc includes a pixel electrode PE and a common electrode CE. The storage capacitor Cst includes the pixel electrode PE and a portion of a storage line STL that overlaps the pixel electrode PE.

The control electrode GE and the storage line STL are disposed on a surface (or an upper surface) of a first base substrate BS1. The first base substrate BS1 may be one of a glass substrate, a plastic substrate, and a substrate including PI. A first dielectric layer 10 is disposed on the surface of the first base substrate BS1 to cover the control electrode GE and the storage line STL. The first dielectric layer 10 may include at least material selected from an inorganic material and an organic material.

An activation part AL is disposed on the first dielectric layer 10 to overlap the control electrode GE. The activation part AL may include a semiconductor layer SCL and an ohmic contact layer OCL. The semiconductor layer SCL is disposed on the first dielectric layer 10, and the ohmic contact layer OCL is disposed on the semiconductor layer SCL.

In an exemplary embodiment, the semiconductor layer SCL may include amorphous silicon or crystalline silicon. Alternatively, the semiconductor layer SCL may include a metal oxide semiconductor. The ohmic contact layer OCL may include dopants doped more heavily than those of the semiconductor layer SCL. In an exemplary embodiment, the ohmic contact layer OCL may include two segments spaced apart from each other. In an alternative exemplary embodiment, the ohmic contact layer OCL may be integrally formed as a single unitary body.

The output electrode DE and the input electrode SE are disposed on the activation part AL. The output electrode DE and the input electrode SE are spaced apart from each other. A second dielectric layer 20 is disposed on the first dielectric layer 10 is provided thereon with to cover the activation part AL, the output electrode DE and the input electrode SE. A third dielectric layer 30 is disposed on the second dielectric layer 20. The second and third dielectric layers 20 and 30 may include at least one material selected from an inorganic material and an organic material. The third dielectric layer 30 may be a single organic layer that provides a planarized surface on elements therebelow. In an exemplary embodiment, the third dielectric layer 30 may include a plurality of color filters. A fourth dielectric layer 40 is disposed on the third dielectric layer 30. The fourth dielectric layer 40 may be an inorganic layer that covers the color filters.

In an exemplary embodiment, as shown in FIG. 3A, the pixel electrode PE is disposed on the fourth dielectric layer 40. The pixel electrode PE is connected to the output electrode DE through a contact hole CH defined through the second, third and fourth dielectric layers 20, 30 and 40. An alignment layer (not shown) may be disposed on the fourth dielectric layer 40 to cover the pixel electrode PE.

A second base substrate BS2 may be one of a glass substrate, a plastic substrate, and a substrate including PI. A black matrix layer BM is disposed on a bottom surface of the second base substrate BS2. In one exemplary embodiment, for example, openings that are defined through the black matrix layer BM to correspond to pixel regions. A spacer CS may be disposed to overlap the black matrix layer BM.

In an exemplary embodiment, dielectric layers are disposed on a bottom surface of the second base substrate BS2 to cover the black matrix layer BM. FIG. 3A illustrates an exemplary embodiment where a fifth dielectric layer 50 provides a planarized surface. In such an embodiment, the fifth dielectric layer 50 may include an organic material.

The common electrode CE is disposed on the bottom surface of the second base substrate BS2. An alignment layer (not shown) may be disposed on the common electrode CE.

In an exemplary embodiment, the common electrode CE may include a transmissive metal, such as transparent conductive oxide ("TCO").

A common voltage is applied to the common electrode CE. The common voltage may have a value the same as or different from that of a pixel voltage. When the common voltage and the pixel voltage have a same value as each other in a liquid crystal display panel of vertical alignment ("VA") mode, an electric potential difference is zero, and in this case, the display region (see DA of FIG. 1) may display a black-colored image.

The cross-section of the pixel PX shown in FIG. 3A is merely exemplary. In an alternative exemplary embodiment, first and second display substrates 100 and 200 may be turned upside down in the third direction DR3. The color filters may be disposed on the second display substrate 200.

Although a liquid crystal display panel of VA mode is exemplarily described with reference to FIG. 3A, the invention is not limited thereto and may be applied to a liquid crystal display panel of in-plane switching ("IPS") mode, fringe-field switching ("FFS") mode, or plane-to-line switching ("PLS") mode.

Referring to FIG. 3B, in an exemplary embodiment, a grayscale display layer of the display panel DP may include an organic light emitting layer. In such an embodiment, the display panel DP may be an organic light emitting display panel. A pixel PX of the organic light emitting display panel may include a switching transistor T1, a driver transistor T2, and a light emitting element OLED.

The organic light emitting display panel includes a first display substrate 100 (referred to hereinafter as a display substrate) and a second display substrate 200 (referred to hereinafter as an encapsulation substrate). The display substrate 100 may include a first base substrate BS1, a circuit element layer DP-CL disposed on the first base substrate BS1, a display element layer DP-OLED disposed on the circuit element layer DP-CL, and a cover layer CL disposed on the display element layer DP-OLED. The encapsulation substrate 200 may include a second base substrate BS2, a black matrix layer BM disposed on the second base substrate BS2, and a color conversion layer CCL disposed on the black matrix layer BM.

The first base substrate BS1 may be one of a glass substrate, a plastic substrate, and a substrate including PI. The circuit element layer DP-CL includes a dielectric layer and a circuit element. The circuit element includes a signal line, a pixel driver circuit, or the like. The circuit element layer DP-CL may be formed by formation processes in which dielectric, semiconductor, and conductive layers are coated or deposited, and by patterning processes in which photolithography is used to pattern the dielectric, semiconductor, and conductive layers.

In an exemplary embodiment, the circuit element layer DP-CL may include a buffer layer BFL, a first dielectric layer 10, a second dielectric layer 20, and a third dielectric layer 30. The first and second dielectric layers 10 and 20 may be inorganic layers, and the third dielectric layer 30 may be an organic layer.

FIG. 3B exemplarily illustrates an arrangement relationship between a first semiconductor pattern OSP1, a second semiconductor pattern OSP2, a first control electrode GE1, a second control electrode GE2, a first input electrode DE1, a first output electrode SE1, a second input electrode DE2, and a second output electrode SE2 that constitute the switching transistor T1 and the driver transistor T2. First, second, third, and fourth through holes CH1, CH2, CH3, and CH4 are also exemplarily illustrated in FIG. 3B.

The display element layer DP-OLED includes the light emitting element OLED. The display element layer DP-OLED may include an organic light emitting diode as the light emitting element OLED. The display element layer DP-OLED includes a pixel definition layer PDL. In one exemplary embodiment, for example, the pixel definition layer PDL may be an organic layer.

A first electrode AE is disposed on an intermediate organic layer 30. The first electrode AE is connected to the second output electrode SE2 through a fifth through hole CH5 that penetrates the intermediate organic layer 30. An opening OP is defined in the pixel definition layer PDL. The opening OP of the pixel definition layer PDL exposes at least a portion of the first electrode AE. The opening OP of the pixel definition layer PDL is also referred to as a light emitting opening.

In an exemplary embodiment, as shown in FIG. 3B, the display panel DP may include a light emitting region PXA and a non-light emitting region NPXA adjacent to the light emitting region PXA. The non-light emitting region NPXA may surround the light emitting region PXA. In an exemplary embodiment, the light emitting region PXA is defined to correspond to a portion of the first electrode AE, a portion of which is exposed to the light emitting opening OP.

A hole control layer HCL may be disposed in common on the light emitting region PXA and the non-light emitting region NPXA. The hole control layer HCL may include a hole transport layer, and further include a hole injection layer. An emission layer EML is disposed on the hole control layer HCL. The emission layer EML may be disposed in common on the light emitting region PXA and the non-light emitting region NPXA. In an exemplary embodiment, the emission layer EML may be disposed on the light emitting region PXA, but not on the non-light emitting region NPXA. The emission layer EML may include an organic material and/or an inorganic material. The emission layer EML may emit a first color light, for example, a blue light.

An electron control layer ECL is disposed on the emission layer EML. The electron control layer ECL may include an electron transport layer, and further include an electron injection layer. An open mask may be used in a way such that the hole control layer HCL and the electron control layer ECL are formed in common on a plurality of pixels. A second electrode CE is disposed on the electron control layer ECL. The second electrode CE is placed in common on a plurality of pixels. The cover layer CL may be disposed on and protect the second electrode CE. The cover layer CL may include an organic material or an inorganic material.

The second base substrate BS2 is dispose to be spaced apart from the cover layer CL. The second base substrate BS2 may be one of a glass substrate, a plastic substrate, and a substrate including PI). Depending on the pixel PX, the color conversion layer CCL may allow a first color light to transmit therethrough or may convert a first color light into a second color light or a third color light. The color conversion layer CCL may include a quantum dot.

In an exemplary embodiment, the encapsulation substrate 200 may be replaced with a thin encapsulation layer. In such an embodiment, the black matrix layer BM and the color conversion layer CCL may be disposed on the thin encapsulation layer.

Figure 4A:
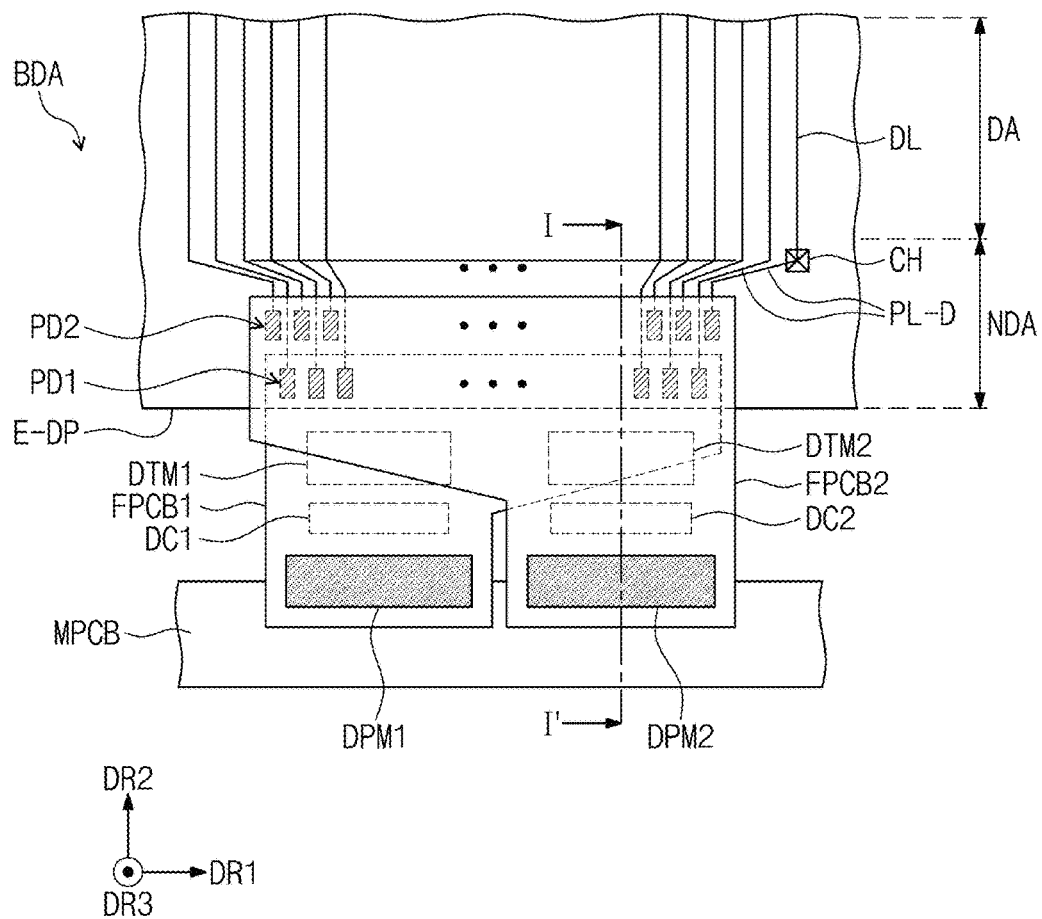
FIG. 4A illustrates an enlarged plan view showing a display apparatus according to an exemplary embodiment of the invention.
Figure 4B:
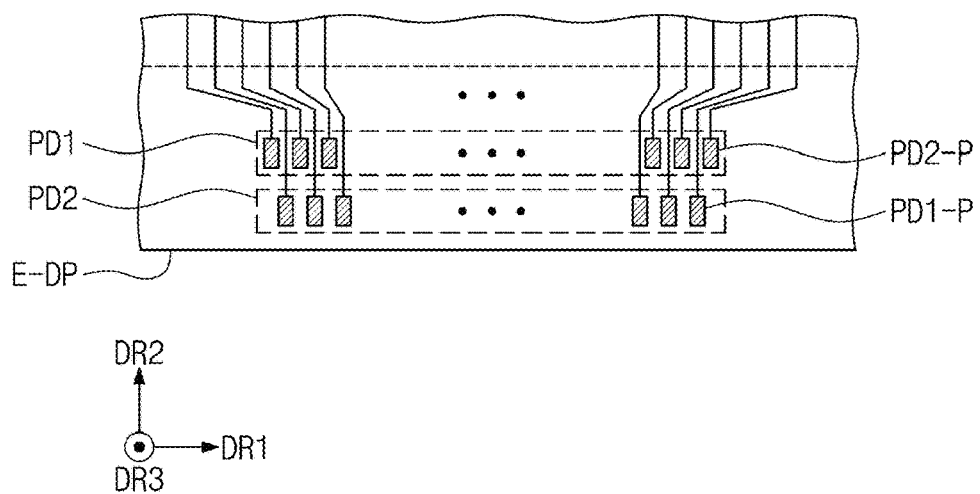
FIG. 4B illustrates an enlarged plan view showing a display panel according to an exemplary embodiment of the invention.
Figure 5A:
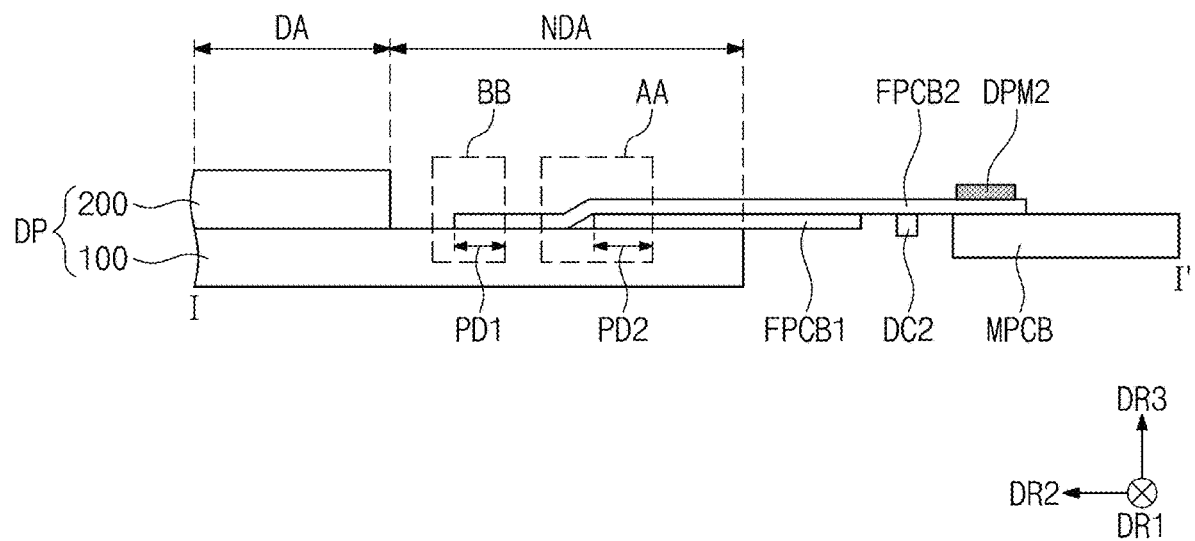
FIG. 5A illustrates a cross-sectional view taken along line I-I' of FIG. 4A.
Figure 5B:
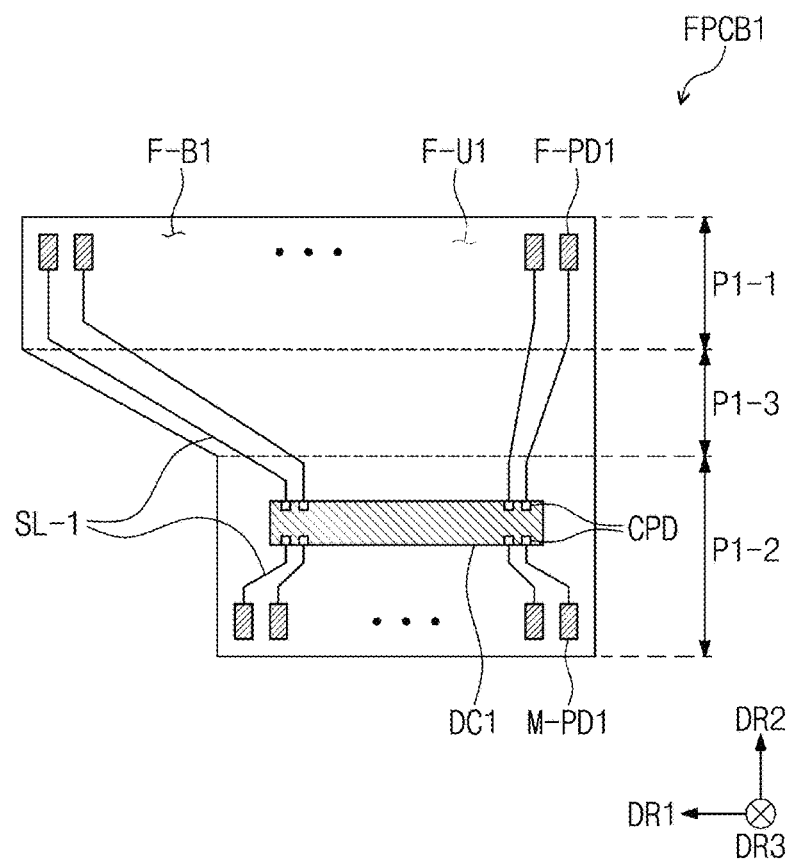
FIGS. 5B and 5C illustrate bottom views showing a flexible circuit board according to an exemplary embodiment of the invention.
Figure 5C:
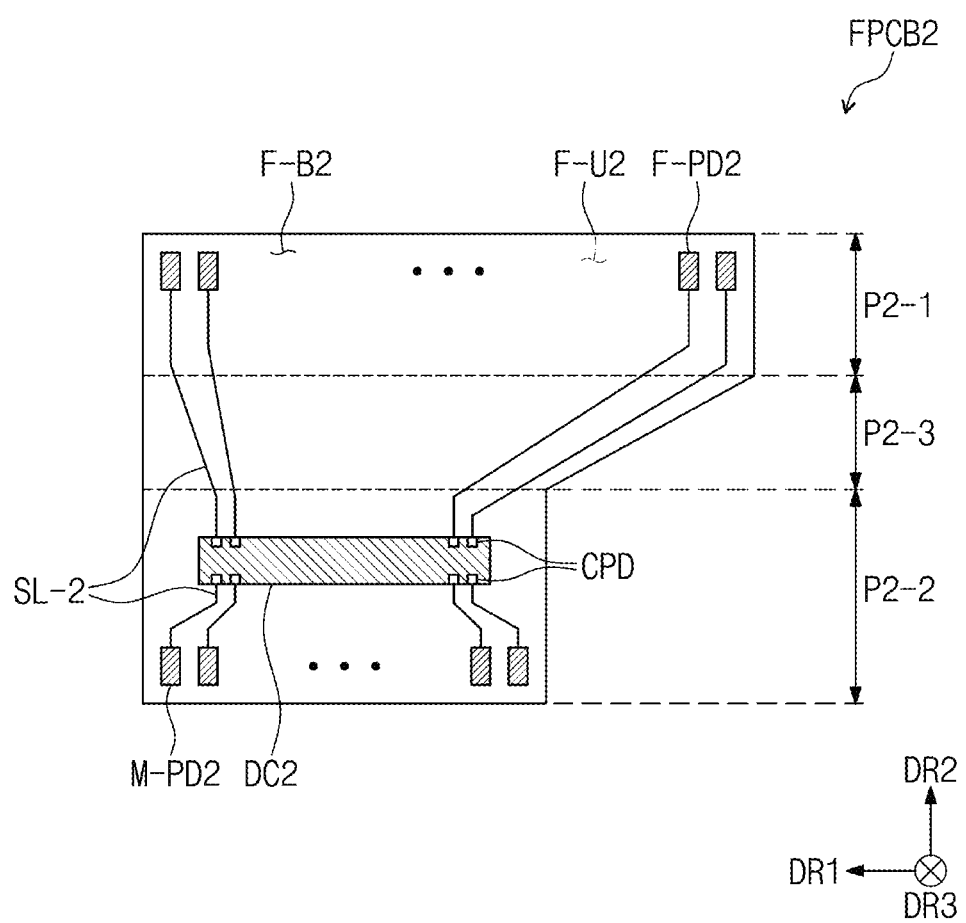
Figure 6A:
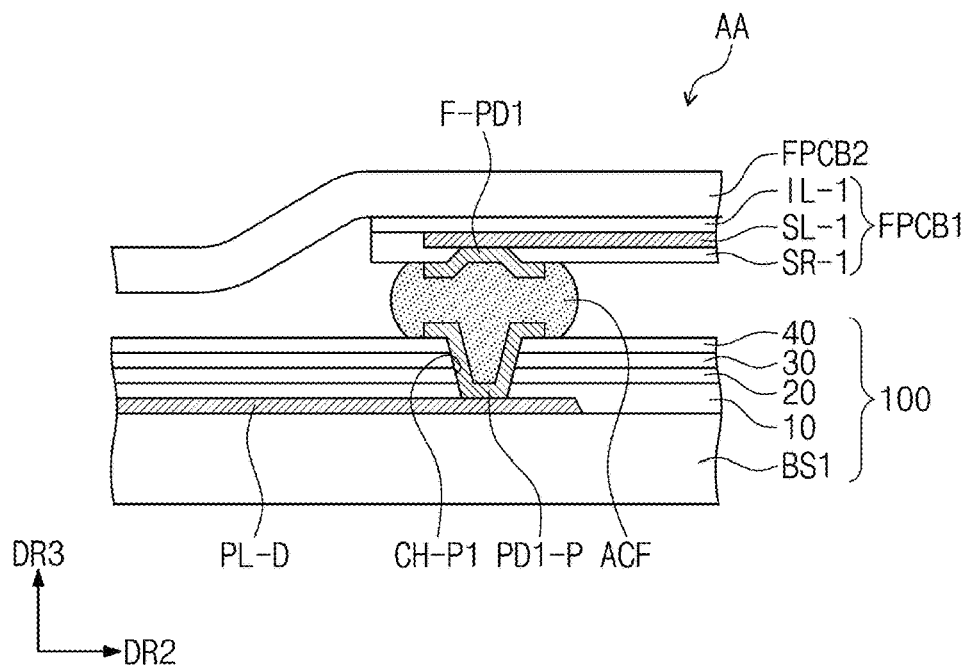
FIG. 6A illustrates an enlarged cross-sectional view showing section AA of FIG. 5A.
Figure 6B:
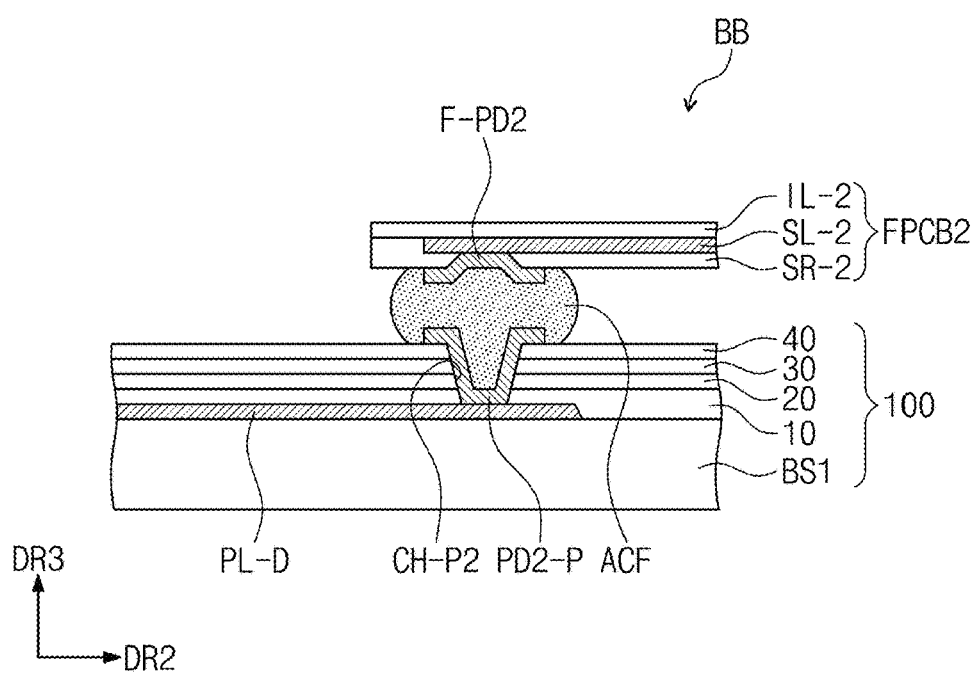
FIG. 6B illustrates an enlarged cross-sectional view showing section BB of FIG. 5A.

FIG. 4A illustrates an enlarged plan view showing a display apparatus according to an exemplary embodiment of the invention. FIG. 4B illustrates an enlarged plan view showing a display panel according to an exemplary embodiment of the invention. FIG. 5A is a cross-sectional view taken along line I-I' of FIG. 4A. FIGS. 5B and 5C illustrate bottom views showing a flexible circuit board according to an exemplary embodiment of the invention. FIG. 6A illustrates an enlarged cross-sectional view showing section AA of FIG. 5A. FIG. 6B illustrates an enlarged cross-sectional view showing section BB of FIG. 5A.

A bonding region BDA of the display apparatus DD is defined by a zone where the flexible circuit boards FPCB1 and FPCB2 are electrically coupled to the display pad region PDA of the display panel DP. Output pads included in each of the flexible circuit boards FPCB1 and FPCB2 overlap the display pad region PDA of the display panel DP.

In an exemplary embodiment, as shown in FIGS. 4A and 4B, the first display pad row PD1 and the second display pad row PD2 are disposed along different rows on the display pad region PDA. The first display pad row PD1 includes a plurality of first display pads PD1-P, and the second display pad row PD2 includes a plurality of second display pads PD2-P.

The first display pads PD1-P are arranged spaced apart from each other along the first direction DR1. The second display pads PD2-P are disposed to be spaced apart in the second direction DR2 from the first display pads PD1-P and arranged spaced apart from each other along the first direction DR1.

When viewed from the edge E-DP or in the second direction DR2, each second display pad PD2-P may be seen between two neighboring first display pads PD1-P. Accordingly, when viewed from the edge E-DP, the first display pads PD1-P and the second display pads PD2-P may be disposed alternately with each other.

The first and second flexible circuit boards FPCB1 and FPCB2 may include pads (not shown) that correspond to the first and second display pads PD1-P and PD2-P.

In one exemplary embodiment, for example, the first flexible circuit board FPCB1 has first output pads (not shown) electrically connected to corresponding first display pads PD1-P, and the second flexible circuit board FPCB2 has second output pads (not shown) electrically connected to corresponding second display pads PD2-P.

The first flexible circuit board FPCB1 and the second flexible circuit board FPCB2 may respectively include a first driver chip DC1 and a second driver chip DC2. Signals may be transferred from the main circuit board MPCB to the driver chips DC1 and DC2, and the signals may then be transferred from the driver chips DC1 and DC2 to the display panel DP. In an exemplary embodiment, each of the driver chips DC1 and DC2 may be a data driver circuit. In an exemplary embodiment, the flexible circuit boards FPCB1 and FPCB2 may transfer signals from the signal controller SC to the display panel DP.

In an exemplary embodiment, the driver chips DC1 and DC2 may be disposed in a layer the same as a layer in which the heat radiation members DTM1 and DTM2 are disposed, and different from a layer in which the deformation prevention members DPM1 and DPM2 are disposed. For convenience of description, dotted lines are used to indicate the driver chips DC1 and DC2 and the heat radiation members DTM1 and DTM2 disposed on bottom surfaces of the flexible circuit boards FPCB1 and FPCB2.

FIG. 5A shows a simplified relationship between the first and second flexible circuit boards FPCB1 and FPCB2 that are connected to the display panel DP. FIG. 5A, for convenience of illustration and description, pads included in each of the display panel, DP, the first flexible circuit board FPCB1, and the second flexible circuit board FPCB2 are omitted.

In an exemplary embodiment, the second flexible circuit board FPCB2 is disposed on the first flexible circuit board FPCB1. The second flexible circuit board FPCB2 may cover at least a portion of the first flexible circuit board FPCB1.

According to an exemplary embodiment of the invention, flexible circuit boards are included to have connection with pads that are arranged on different rows, such that an area of a region where the display pads PD1-P and PD2-P shown in FIG. 4B are disposed may be reduced. Accordingly, in such an embodiment, an area of the non-display region NDA, on which the display pads PD1-P and PD2-P are disposed, may be reduced and the display apparatus DD may have a narrow bezel.

Referring to FIGS. 5B and 5C, in an exemplary embodiment, the first flexible circuit board FPCB1 includes a first top surface F-U1 and a first bottom surface F-B1 opposite to the first top surface F-U1. The first flexible circuit board FPCB1 includes first board signal lines SL-1, a first driver chip DC1 disposed on the first bottom surface F-B1, and a plurality of first board pads F-PD1, M-PD1, and CPD that are exposed from the first bottom surface F-B1.

The first board pads F-PD1, M-PD1, CPD may include coupling pads CPD coupled to coupling terminals of the first driver chip DC1, first output pads F-PD1 coupled to the display panel DP, and first input pads M-PD1 coupled to the main circuit board MPCB.

The first board signal lines SL-1 connect the coupling pads CPD to the first output pads F-PD1, and also connect the coupling pads CPD to the first input pads M-PD1. In an exemplary embodiment, where the first driver chip DC1 is omitted, the first board signal lines SL-1 may connect the first output pads F-PD1 to the first input pads M-PD1.

In an exemplary embodiment, the first flexible circuit board FPCB1 may be divided into a plurality of segments. In one exemplary embodiment, for example, the first flexible circuit board FPCB1 may include a first output segment P1-1 where the first output pads F-PD1 are disposed, a first input segment P1-2 where the first input pads M-PD1 are disposed, and a first connection segment P1-3 that connects the first output segment P1-1 to the first input segment P1-2.

The first output segment P1-1 may have a width in the first direction DR1 greater than a width in the first direction DR1 of the first input segment P1-2. Thus, when viewed in a plan view, the first connection segment P1-3 may have an inclined side extending from the first output segment P1-1 to the first input segment P1-2.

In an exemplary embodiment, as shown in FIG. 5B, the first driver chip DC1 may be disposed on the first input segment P1-2, but the invention is not limited thereto. Alternatively, the first driver chip DC1 may be disposed on either the first output segment P1-1 or the first connection segment P1-3.

In an exemplary embodiment, the second flexible circuit board FPCB2 includes a second top surface F-U2 and a second bottom surface F-B2 opposite to the second top surface F-U2. The second flexible circuit board FPCB2 includes second board signal lines SL-2, a second driver chip DC2 disposed on the second bottom surface F-B2, and a plurality of second board pads F-PD2, M-PD2, and CPD that are exposed from the second bottom surface F-B2.

The second board pads F-PD2, M-PD2, CPD may include coupling pads CPD coupled to coupling terminals of the second driver chip DC2, second output pads F-PD2 coupled to the display panel DP, and second input pads M-PD2 coupled to the main circuit board MPCB.

The second board signal lines SL-2 connect the coupling pads CPD to the second output pads F-PD2, and also connect the coupling pads CPD to the second input pads M-PD2. In an exemplary embodiment, where the second driver chip DC2 is omitted, the second board signal lines SL-2 may connect the second output pads F-PD2 to the second input pads M-PD2.

In an exemplary embodiment, the second flexible circuit board FPCB2 may be divided into a plurality of segments. In one exemplary embodiment, for example, the second flexible circuit board FPCB2 may include a second output segment P2-1 where the second output pads F-PD2 are disposed, a second input segment P2-2 where the second input pads M-PD2 are disposed, and a second connection segment P2-3 that connects the second output segment P2-1 to the second input segment P2-2.

The second output segment P2-1 may have a width in the first direction DR1 greater than a width in the first direction DR1 of the second input segment P2-2. Thus, when viewed in a plan view, the second connection segment P2-3 may have an inclined side extending from the second output segment P2-1 to the second input segment P2-2.

In an exemplary embodiment, as shown in FIG. 5C, the second driver chip DC2 may be disposed on the second input segment P2-2, but the invention is not limited thereto. Alternatively, the second driver chip DC2 may be disposed on either the second output segment P2-1 or the second connection segment P2-3.

According to an exemplary embodiment of the invention, the first flexible circuit board FPCB2 may have a width in the second direction DR2 less than a width in the second direction DR2 of the second flexible circuit board FPCB2. In one exemplary embodiment, for example, a sum of widths in the second direction DR2 of the first output, connection, and input segments P1-1, P1-3, and P1-2 is less than a sum of widths in the second direction DR2 of the second output, connection, and input segments P2-1, P2-3, and P2-2. Therefore, as shown in FIG. 5A, the second output segment P2-1 of the second flexible circuit board FPCB2 may cover at least a portion of the first output segment P1-1 of the first flexible circuit board FPCB1.

FIGS. 6A and 6B illustrate the first display substrate 100 employed in the liquid crystal display panel shown in FIG. 3A.

Referring to FIG. 6A, the first display pad PD1-P is connected to the subsidiary signal line PL-D through a first contact hole CH-P1 defined through the first to fourth dielectric layers 10 to 40. The first display pad PD1-P is exposed from the first to fourth dielectric layers 10 to 40. In an exemplary embodiment, where the first display pad PD1-P is omitted, an end portion of the subsidiary signal line PL-D may be exposed from the first to fourth dielectric layers 10 to 40.

In an exemplary embodiment, as shown in FIG. 6A, the first flexible circuit board FPCB1 may include a first dielectric layer IL-1, a first board signal line SL-1, a first solder resist layer SR-1, and a first output pad F-PD1. An opening is defined through the first solder resist layer SR-1 to expose at least a portion of the first board signal line SL-1. The first output pad F-PD1 may be connected to the first board signal line SL-1 that is exposed to the opening of the first solder resist layer SR-1. The first output pad F-PD1 is electrically coupled through an ACF to the first display pad PD1-P.

Referring to FIG. 6B, the second display pad PD2-P is connected to the subsidiary signal line PL-D through a second contact hole CH-P2 defined through the first to fourth dielectric layers 10 to 40. The second display pad PD2-P is exposed from the first to fourth dielectric layers 10 to 40. In an exemplary embodiment, where the second display pad PD2-P is omitted, an end portion of the subsidiary signal line PL-D may be exposed from the first to fourth dielectric layers 10 to 40.

In an exemplary embodiment, as shown in FIG. 6B, the second flexible circuit board FPCB2 may include a second dielectric layer IL-2, a second board signal line SL-2, a second solder resist layer SR-2, and a second output pad F-PD2. An opening is defined through the second solder resist layer SR-2 to expose at least a portion of the second board signal line SL-2. The second output pad F-PD2 may be connected to the second board signal line SL-2 that is exposed to the opening of the second solder resist layer SR-2. The second output pad F-PD2 is electrically coupled through an ACF to the second display pad PD2-P.

In an exemplary embodiment, where the ACFs are used to couple the output pads F-PD1 and F-PD2 to the display pads PD1-P and PD2-P, the flexible circuit boards FPCB1 and FPCB2 are compressed with a tool bar at high temperature, and in this case, the flexible circuit boards FPCB1 and FPCB2 may be deformed due to heat transferred by radiation from the tool bar at high temperature and/or by conduction through the flexible circuit boards FPCB1 and FPCB2.

According to an exemplary embodiment of the invention, the deformation prevention members (see DPM1 and DPM2 of FIG. 4A) are included to increase rigidity of the flexible circuit boards FPCB1 and FPCB2, such that the flexible circuit boards FPCB1 and FPCB2 may be minimized from being deformed when the ACFs are used for bonding of the flexible circuit boards FPCB1 and FPCB2. In such an embodiment, alignment between pads and to provide the display apparatus DD may be improved with increased reliability.

Figure 7A:
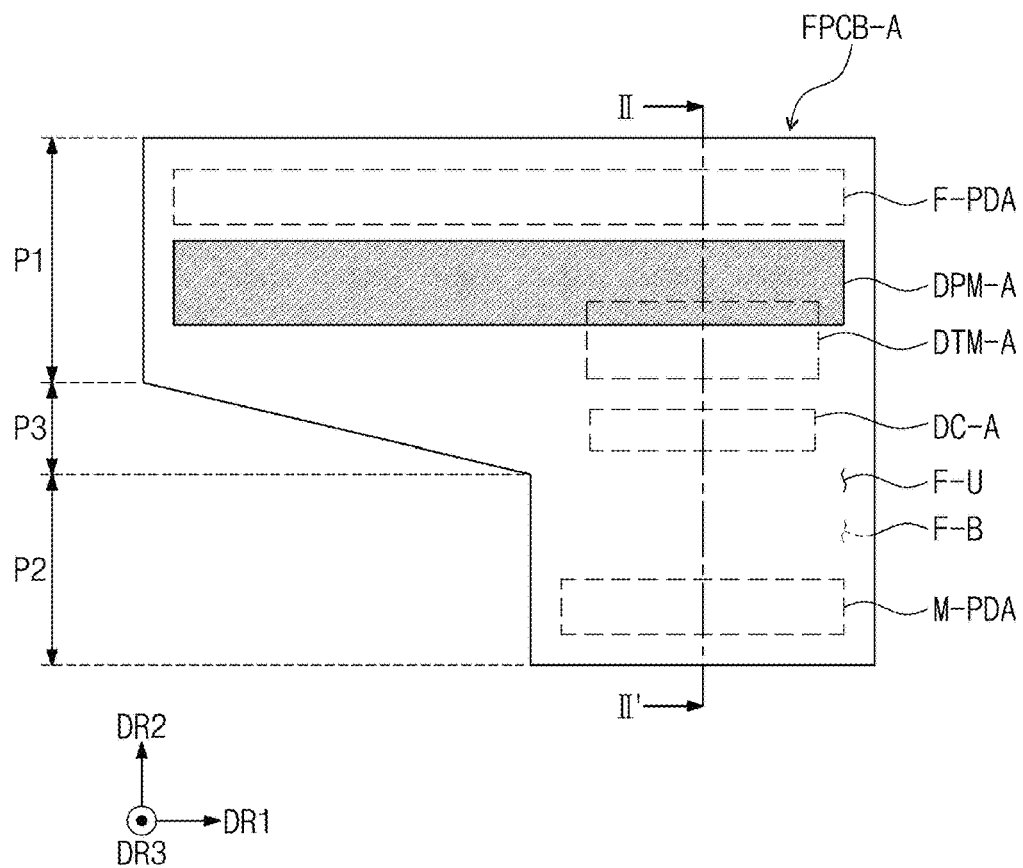
FIG. 7A illustrates a plan view showing a flexible circuit board according to an alternative exemplary embodiment of the invention.
Figure 7B:
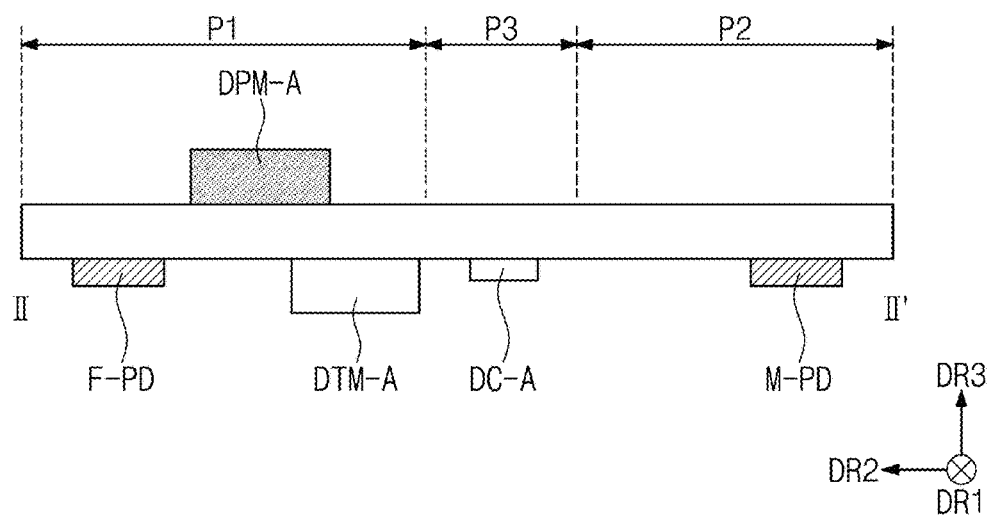
FIG. 7B illustrates a cross-sectional view taken along line II-II' of FIG. 7A.
Figure 8A:
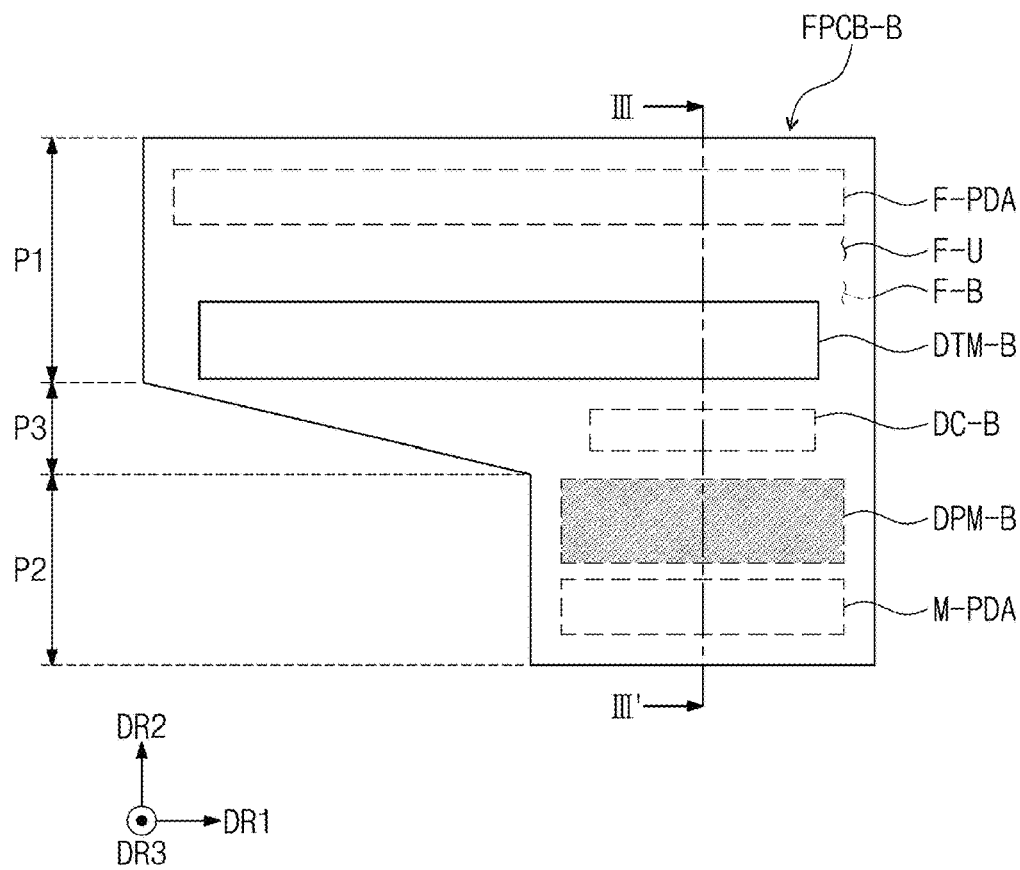
FIG. 8A illustrates a plan view showing a flexible circuit board according to another alternative exemplary embodiment of the invention.
Figure 8B:
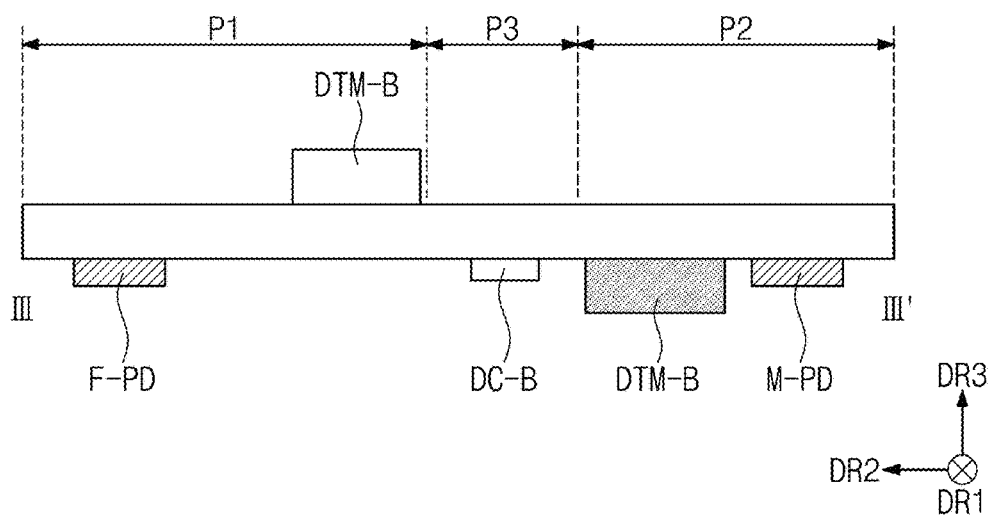
FIG. 8B illustrates a cross-sectional view taken along line III-III' of FIG. 8A.
Figure 9A:
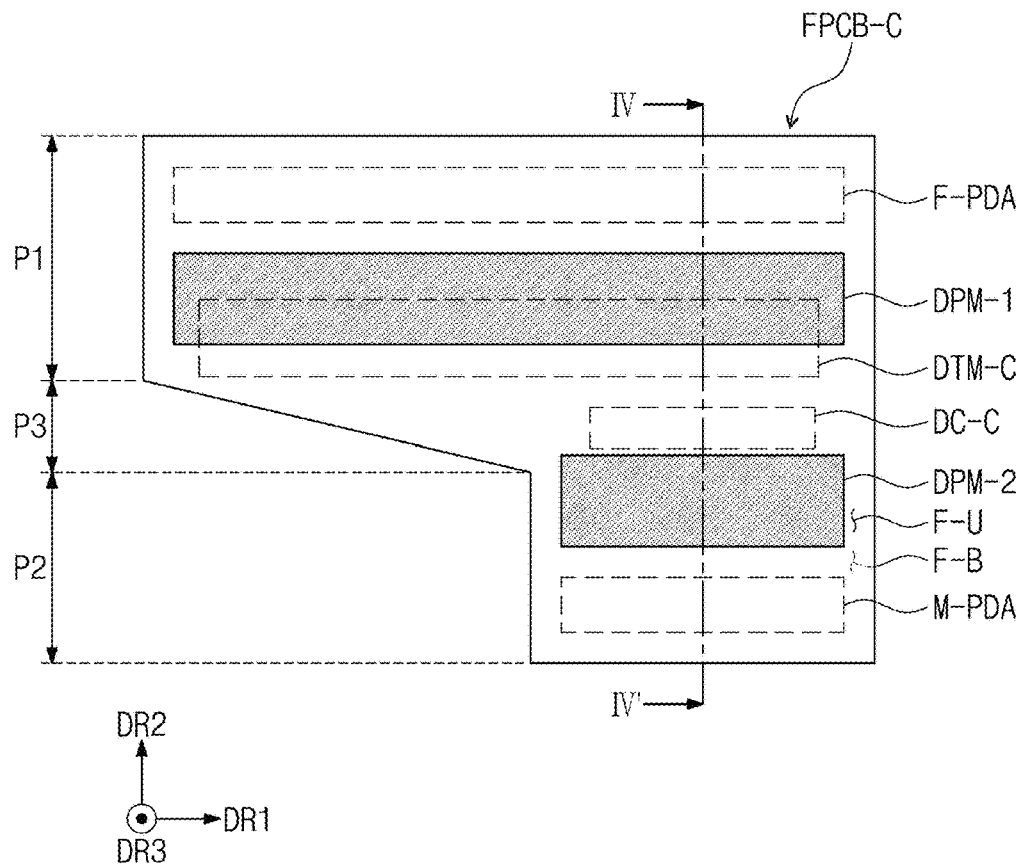
FIG. 9A illustrates a plan view showing a flexible circuit board according to another alternative exemplary embodiment of the invention.
Figure 9B:
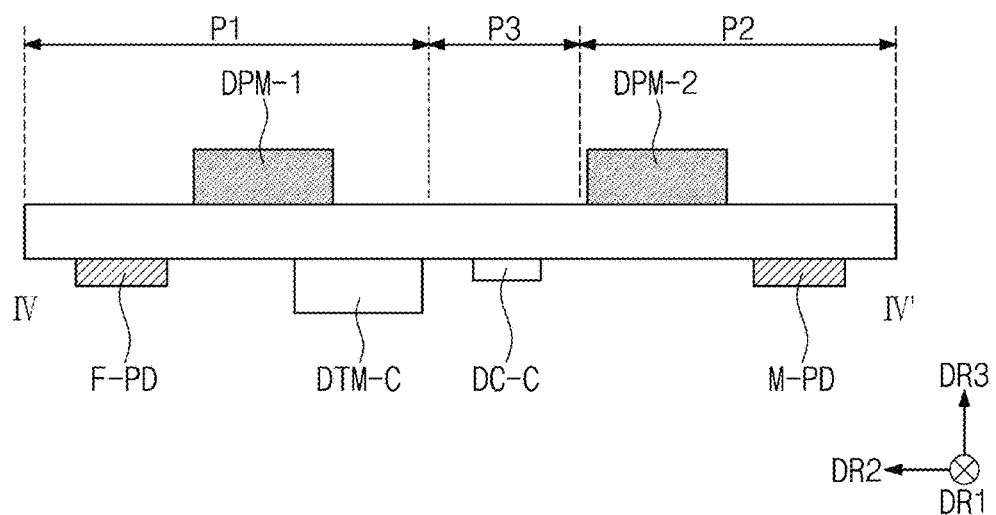
FIG. 9B illustrates a cross-sectional view taken along line IV-IV' of FIG. 9A.

FIG. 7A illustrates a plan view showing a flexible circuit board according to an alternative exemplary embodiment of the invention. FIG. 7B illustrates a cross-sectional view taken along line II-II' of FIG. 7A. FIG. 8A illustrates a plan view showing a flexible circuit board according to another alternative exemplary embodiment of the invention. FIG. 8B illustrates a cross-sectional view taken along line III-III' of FIG. 8A. FIG. 9A illustrates a plan view showing a flexible circuit board according to another alternative exemplary embodiment of the invention. FIG. 9B illustrates a cross-sectional view taken along line IV-IV' of FIG. 9A.

The same reference numerals are allocated to components identical or similar to those described above with reference to FIGS. 1 to 6B, and a repetitive detailed description thereof will be omitted. Flexible circuit boards FPCB-A, FPCB-B, and FPCB-C shown in FIGS. 7A to 9B may correspond to the second flexible circuit board FPCB2 discussed with reference to FIGS. 1 to 6B. The invention, however, is not limited thereto, and flexible circuit boards FPCB-A, FPCB-B, and FPCB-C described below with reference to FIGS. 7A to 9B may also correspond to the first flexible circuit board FPCB1 described above with reference to FIGS. 1 to 6B.

Referring to FIGS. 7A and 7B, in an exemplary embodiment, a flexible circuit board FPCB-A includes a top surface F-U and a bottom surface F-B opposite to the top surface F-U.

In an exemplary embodiment, the flexible circuit board FPCB-A may be divided into a plurality of segments. In one exemplary embodiment, for example, the flexible circuit board FPCB-A may include an output segment P1 that includes an output pad region F-PDA where output pads F-PD are disposed, an input segment P2 that includes an input pad region M-PDA where input pads M-PD are disposed, and a connection segment P3 that connects the output segment P1 to the input segment P2.

In an exemplary embodiment, a deformation prevention member DPM-A and a heat radiation member DTM-A may be disposed to be spaced apart from each other across the flexible circuit board FPCB-A. In one exemplary embodiment, for example, the deformation prevention member DPM-A may be disposed on the top surface F-U of the output segment P1. The deformation prevention member DPM-A may be disposed adjacent to the output pads F-PD, and thus the deformation prevention member DPM-A may prevent the input segment P2 of the flexible circuit board FPCB-A from receiving heat transferred by conduction that occurs when the output pads F-PD are compressed during a manufacturing process. In such an embodiment, the deformation prevention member DPM-A including a metal may be attached to the flexible circuit board FPCB-A, such that the flexible circuit board FPCB-A may increase in rigidity.

In such an embodiment, the heat radiation member DTM-A may be disposed on the bottom surface F-B of the output segment P1. The heat radiation member DTM-A may be disposed adjacent to a driver chip DC-A, and the heat radiation member DTM-A may absorb heat generated from the driver chip DC-A, such that damage to the flexible circuit board FPCB-A due to the heat may be effectively prevented.

In an exemplary embodiment, as described above, the deformation prevention member DPM-A and the heat radiation member DTM-A may be disposed on different surfaces of a same segment, but not being limited thereto. In such an embodiment, the deformation prevention member DPM-A and the heat radiation member DTM-A may be disposed, but not limited to, on different segments across the flexible circuit board FPCB-A on different surfaces of the flexible circuit board FPCB-A.

Referring to FIGS. 8A and 8B, in an alternative exemplary embodiment, a flexible circuit board FPCB-B includes a top surface F-U and a bottom surface F-B opposite to the top surface F-U.

In an exemplary embodiment, the flexible circuit board FPCB-B may be divided into a plurality of segments. In one exemplary embodiment, for example, the flexible circuit board FPCB-B may include an output segment P1 that includes an output pad region F-PDA where output pads F-PD are disposed, an input segment P2 that includes an input pad region M-PDA where input pads M-PD are disposed, and a connection segment P3 that connects the output segment P1 to the input segment P2.

In an exemplary embodiment, a deformation prevention member DPM-B and a heat radiation member DTM-B may be disposed to be spaced apart from each other across the flexible circuit board FPCB-B. In one exemplary embodiment, for example, on the top surface F-U, the deformation prevention member DPM-B may be disposed on the input segment P2. When the output pad F-PD are compressed during a manufacturing process, the deformation prevention member DPM-B may prevent the input segment P2 of the flexible circuit board FPCB-B from receiving heat transferred by radiation through conductive and/or dielectric layers included in the flexible circuit board FPCB-B. Therefore, the input segment P2 of the flexible circuit board FPCB-B may be prevented from being deformed. In such an embodiment, the deformation prevention member DPM-B including a metal may be attached to the flexible circuit board FPCB-B, such that the flexible circuit board FPCB-B may increase in rigidity.

In an exemplary embodiment, the heat radiation member DTM-B may be disposed on the top surface F-U of the output segment P1. The heat radiation member DTM-B may be disposed on a different surface from that on which a driver chip DC-B is placed, and thus heat generated from the driver chip DC-B may be prevented from transferring toward the top surface F-U of the flexible circuit board FPCB-B.

In an exemplary embodiment, the deformation prevention member DPM-B and the heat radiation member DTM-B are disposed on different surfaces and on different segments, but not being limited thereto. In such an embodiment, the deformation prevention member DPM-A and the heat radiation member DTM-A may be disposed, but not limited to, on a same segment across the flexible circuit board FPCB-B on different surfaces of the flexible circuit board FPCB-B.

Referring to FIGS. 9A and 9B, in another alternative exemplary embodiment, a flexible circuit board FPCB-C includes a top surface F-U and a bottom surface F-B opposite to the top surface F-U.

In such an embodiment, the flexible circuit board FPCB-C may be divided into a plurality of segments. In one exemplary embodiment, for example, the flexible circuit board FPCB-C may include an output segment P1 that includes an output pad region F-PDA where output pads F-PD are disposed, an input segment P2 that includes an input pad region M-PDA where input pads M-PD are disposed, and a connection segment P3 that connects the output segment P1 to the input segment P2.

In such an embodiment, a deformation prevention member may be provided in plural. In one exemplary embodiment, for example, the deformation prevention member may include a first prevention member DPM-1 and a second prevention member DPM-2.

In such an embodiment, the first prevention member DPM-1 may be disposed on the top surface F-U of the output segment P1, and the second prevention member DPM-2 may be disposed on the top surface F-U of the input segment P2. Therefore, the first prevention member DPM-1 may prevent the input segment P2 of the flexible circuit board FPCB-C from receiving heat transferred by conduction that occurs when the output pads F-PD are compressed during a manufacturing process, and the second prevention member DPM-2 may prevent the input segment P2 of the flexible circuit board FPCB-C from receiving heat transferred by radiation, which occurs when the output pads F-PD are compressed during a manufacturing process, through conductive and/or dielectric layers included in the flexible circuit board FPCB-C. Accordingly, the input segment P2 of the flexible circuit board FPCB-C may be prevented from being deformed. In such an embodiment, the deformation prevention member DPM-C including a metal may be attached to the flexible circuit board FPCB-C, such that the flexible circuit board FPCB-C may increase in rigidity.

In an exemplary embodiment, a heat radiation member DTM-C may be disposed on the top surface F-U of the output segment P1. The heat radiation member DTM-C may be disposed adjacent to a driver chip DC-C, and the heat radiation member DTM-C may absorb heat generated from the driver chip DC-C, such that damage to the flexible circuit board FPCB-C due to the heat may be effectively prevented.

In an exemplary embodiment, a plurality of prevention members DPM-1 and DPM-2 are disposed on a same surface, but not being limited thereto. In an alternative exemplary embodiment, the plurality of prevention members DPM-1 and DPM-2 may be placed on different surfaces of the flexible circuit board FPCB-C.

Figure 10:
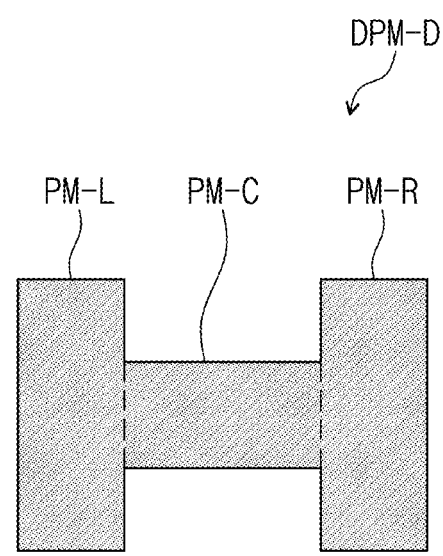
FIG. 10 illustrates a plan view showing a flexible circuit board according to another alternative exemplary embodiment of the invention.

FIG. 10 illustrates a plan view showing a flexible circuit board according to another alternative exemplary embodiment of the invention. The same reference numerals are allocated to components identical or similar to those discussed with reference to FIGS. 1 to 6B, and any repetitive detailed description thereof will be omitted.

In an exemplary embodiment, a deformation prevention member DPM-D may include a first member PM-L, a second member PM-R, and a connection member PM-C. The connection member PM-C may be disposed between and connect the first member PM-L and the second member PM-R.

The first member PM-L and the second member PM-R may extend along the second direction DR2, and the connection member PM-C may extend along the first direction DR1. When viewed in a plan view, the deformation prevention member DPM-D may have an H-like shape.

Although not shown, the deformation prevention member DPM-D may be configured in a way such that each of the first, second, and connection members PM-L, PM-R, and PM-C is provided in plural, and the plurality of first, second, and connection members PM-L, PM-R, and PM-C are disposed alternately with each other. The plurality of first, second, and connection members PM-L, PM-R, and PM-C may be alternately disposed along the first direction DR1 or the second direction DR2.

Alternatively, the first member PM-L and the second member PM-R may be disposed to be spaced apart in the first direction DR1 from each other without the connection member PM-C or one of the first member PM-L and the second member PM-R may be omitted, but the invention is not limited thereto.

In an exemplary embodiment, the deformation prevention members DPM1 and DPM2 may have a rectangular shape as shown in FIG. 4A, but not being limited thereto. Alternatively, the deformation prevention members DPM1 and DPM2 may have, but not limited to, one of other shapes, such as a circular shape, and an oval shape, for example.

Although not shown, the heat radiation members DTM1 and DTM2 of FIG. 4A may have a same shape as that of one of the deformation prevention members DPM1, DPM2, and DPM-D described above, but the invention is not limited thereto.

According to exemplary embodiments of the invention, a display apparatus may include a deformation prevention member to prevent a flexible circuit board from being deformed due to heat transferred by conduction that occurs when pads are compressed with AFCs during a manufacturing process. As a result, in such an embodiment, alignment between the pads may be improved and the display apparatus is provided with increased reliability.

The invention should not be construed as being limited to the exemplary embodiments set forth herein. Rather, these exemplary embodiments are provided so that this disclosure will be thorough and complete and will fully convey the concept of the invention to those skilled in the art.

While the invention has been particularly shown and described with reference to exemplary embodiments thereof, it will be understood by those of ordinary skill in the art that various changes in form and details may be made therein without departing from the spirit or scope of the invention as defined by the following claims.

What is claimed is:

1. A display apparatus comprising:
a display panel including a plurality of first display pads arranged in a first direction and a plurality of second display pads arranged in the first direction, wherein the second display pads are spaced apart in a second direction from the first display pads, and the second direction intersects the first direction;
a main circuit board;
a first flexible circuit board which connects the main circuit board to the first display pads;
a second flexible circuit board which connects the main circuit board to the second display pads and overlaps at least a portion of the first flexible circuit board;
a plurality of heat radiation members on the first flexible circuit board and the second flexible circuit board; and
a deformation prevention member spaced apart from the heat radiation members and attached to at least one of the first flexible circuit board and the second flexible circuit board, wherein the deformation prevention member includes a metal.

2. The display apparatus of claim 1, wherein
the first flexible circuit board includes:
a first top surface;
a first bottom surface opposite to the first top surface;
a plurality of first board pads exposed from the first bottom surface and connected to the first display pads and the main circuit board, and
a first driver chip on the first bottom surface,
the second flexible circuit board includes:
a second top surface;
a second bottom surface opposite to the second top surface, wherein the second bottom surface covers at least a portion of the first top surface;
a plurality of second display pads that are exposed from the second bottom surface and are connected to the second display pads and the main circuit board; and
a second driver chip on the second bottom surface, and
the first driver chip and the second driver chip are spaced apart from each other when viewed in a plan view.

3. The display apparatus of claim 2, wherein the deformation prevention member is disposed on at least one of the first top surface and the second top surface.

4. The display apparatus of claim 2, wherein
the deformation prevention member is disposed on at least one of the first bottom surface and the second bottom surface, and
the deformation prevention member is spaced apart from the first driver chip and the second driver chip.

5. The display apparatus of claim 2, wherein the deformation prevention member is disposed on a surface the same as a surface on which the heat radiation members are disposed.

6. The display apparatus of claim 2, wherein the deformation prevention member is disposed on a surface different from a surface on which the heat radiation members are disposed.

7. The display apparatus of claim 1, wherein each of the first flexible circuit board and the second flexible circuit board includes:
a dielectric layer;
a plurality of board signal lines on the dielectric layer;
a solder resist layer in which an opening is defined to expose a portion of the board signal lines, and
a plurality of board pads, each of which is connected to a portion of a corresponding board signal line of the board signal lines,
wherein the portion of the corresponding board signal line is exposed through the opening,
the board pads of the first flexible circuit board and the board pads of the second flexible circuit board are connected through an anisotropic conductive film to the first display pads and the second display pads.

8. The display apparatus of claim 7, wherein
the board pads of the first flexible circuit board include a plurality of first output pads connected to the first display pads and a plurality of first input pads connected to the main circuit board, and
the board pads of the second flexible circuit board include a plurality of second output pads connected to the second display pads and a plurality of second input pads connected to the main circuit board.

9. The display apparatus of claim 8, wherein
the first flexible circuit board includes a first output segment where the first output pads are disposed, a first input segment where the first input pads are disposed, and a first connection segment which connects the first output segment to the first input segment,
the second flexible circuit board includes a second output segment where the second output pads are disposed, a second input segment where the second input pads are disposed, and a second connection segment which connects the second output segment to the second input segment, and
the first input segment and the second input segment are spaced apart from each other.

10. The display apparatus of claim 9, wherein the second output segment covers at least a portion of the first output segment.

11. The display apparatus of claim 9, wherein a sum of a width in the second direction of the first input segment, a width in the second direction of the first connection segment and a width in the second direction of the first output segment is less than a sum of a width in the second direction of the second input segment, a width in the second direction of the second connection segment and a width in the second direction of the second output segment.

12. A display apparatus comprising:
a display panel including a plurality of first display pads arranged in a first direction and a plurality of second display pads arranged in the first direction, wherein the second display pads are spaced apart in a second direction from the first display pads, and the second direction intersects the first direction;
a main circuit board;
a first flexible circuit board including a first output segment including a plurality of first output pads connected to the first display pads, a first input segment including a plurality of first input pads connected to the main circuit board, and a first connection segment that connects the first output segment to the first input segment;
a second flexible circuit board including a second output segment including a plurality of second output pads connected to the second display pads, a second input segment including a plurality of second input pads connected to the main circuit board, and a second connection segment which connects the second output segment to the second input segment;
a plurality of heat radiation members on the first flexible circuit board and the second flexible circuit board; and
a deformation prevention member spaced apart from the heat radiation members and attached to at least one of the first input segment and the second input segment.

13. The display apparatus of claim 12, wherein
the heat radiation members include polyimide, and
the deformation prevention member includes a metal.

14. The display apparatus of claim 12, wherein
the first flexible circuit board includes a first top surface, a first bottom surface which is opposite to the first top surface and exposes the first output pads and the first input pads, and a first driver chip on the first bottom surface,
the second flexible circuit board includes a second top surface, a second bottom surface which is opposite to the second top surface and exposes the second output pads and the second input pads, and a second driver chip on the second bottom surface, and
the first driver chip and the second driver chip are spaced apart from each other when viewed in plan.

15. The display apparatus of claim 14, wherein the deformation prevention member is disposed on at least one of the first top surface and the second top surface.

16. The display apparatus of claim 14, wherein
the deformation prevention member is disposed on at least one of the first bottom surface and the second bottom surface, and
the deformation prevention member is spaced apart from the first driver chip and the second driver chip.

17. The display apparatus of claim 14, wherein the deformation prevention member is disposed on a same surface as a surface on which the heat radiation members are disposed.

18. The display apparatus of claim 14, wherein the deformation prevention member is disposed on a surface different from a surface on which the heat radiation members are disposed.

19. The display apparatus of claim 12, wherein
the first display pads are connected through a plurality of anisotropic conductive films to the first output pads, and
the second display pads are connected through an anisotropic conductive film to the second output pads.

20. The display apparatus of claim 12, wherein
the second output segment covers at least a portion of the first output segment, and
the first input segment and the second input segment are spaced apart from each other.

* * * * *